(12) United States Patent
Mimura

(10) Patent No.: US 6,515,215 B1
(45) Date of Patent: Feb. 4, 2003

(54) PHOTOVOLTAIC MODULE, PHOTOVOLTAIC MODULE ARRAY, PHOTOVOLTAIC SYSTEM, AND METHOD OF DETECTING FAILURE OF PHOTOVOLTAIC MODULE

(75) Inventor: Toshihiko Mimura, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/266,830

(22) Filed: Mar. 12, 1999

(30) Foreign Application Priority Data

Mar. 13, 1998 (JP) ............................. 10-080592
Mar. 11, 1999 (JP) ............................. 11-065441

(51) Int. Cl.$^7$ .................. H01L 25/00; H01L 31/00; H02N 6/00
(52) U.S. Cl. ................ 136/244; 136/291; 136/293; 323/906
(58) Field of Search ................ 136/244, 290, 136/291, 293; 363/80, 79, 95; 323/906, 299

(56) References Cited

U.S. PATENT DOCUMENTS

| | | | | |
|---|---|---|---|---|
| 3,896,368 A | * | 7/1975 | Rym ............................. | 323/8 |
| 4,375,662 A | * | 3/1983 | Baker ........................... | 363/95 |
| 4,453,119 A | * | 6/1984 | Staler et al. .................. | 320/39 |
| 4,742,291 A | * | 5/1988 | Bobier et al. ................. | 320/39 |
| 5,025,202 A | * | 6/1991 | Ishii et al. .................... | 320/32 |
| 5,027,051 A | * | 6/1991 | Lafferty ....................... | 323/222 |
| 5,621,248 A | * | 4/1997 | De Villiers ................... | 290/30 |
| 5,654,883 A | * | 8/1997 | Takehara et al. ............. | 363/79 |
| 5,669,987 A | * | 9/1997 | Takehara et al. ............. | 136/244 |
| 5,703,468 A | * | 12/1997 | Pertillo ........................ | 320/39 |
| 5,712,572 A | * | 1/1998 | Tamechika et al. .......... | 324/551 |
| 5,726,505 A | * | 3/1998 | Yamada et al. .............. | 307/127 |
| 5,867,011 A | * | 2/1999 | Jo et al. ........................ | 323/299 |

FOREIGN PATENT DOCUMENTS

| | | | |
|---|---|---|---|
| EP | 0677749 A2 * | 4/1995 | ........... G01R/31/26 |
| JP | 6-125105 | 5/1994 | |
| JP | 9-148613 | 6/1997 | |

* cited by examiner

*Primary Examiner*—Harold Pyon
*Assistant Examiner*—Michael C. Miggins
(74) *Attorney, Agent, or Firm*—Fitzpatrick, Cella, Harper & Scinto

(57) ABSTRACT

The present invention provides a photovoltaic module comprising a photovoltaics and a signal generation means for generating a signal by application of a voltage, wherein the photovoltaics and the signal generating means are connected in parallel and the voltage is a voltage output by the photovoltaics which is connected in parallel with at least the signal generating means, thereby enabling detection of and detect a failed photovoltaic module, regardless of the structure of a photovoltaic module array or the failure mode of the photovoltaic module.

28 Claims, 20 Drawing Sheets

PHOTOVOLTAIC MODULE, PHOTOVOLTAIC MODULE ARRAY, PHOTOVOLTAIC SYSTEM, AND METHOD OF DETECTING FAILURE OF PHOTOVOLTAIC MODULE

BACKGROUND OF THE INVENTION

1. Field of the Invention

The present invention relates to a photovoltaic module, a photovoltaic module array, a photovoltaic system (photovoltaic power generation apparatus), and a method of detecting failure of a photovoltaic module.

2. Related Background Art

With the recent spreading use of photovoltaic modules, there is a rapidly growing demand for photovoltaic modules suitable for use in medium-scale electric power systems installed outdoors, particularly in the personal houses. Generally, in the case of using the photovoltaic module for electric power generation, a plurality of the photovoltaic modules are connected in series (hereinafter, referred to as "string") for generating a voltage not smaller than a certain value, and a plurality of the strings are connected in parallel to form a photovoltaic module array.

FIG. 29 is a circuit diagram showing the constitution of a conventional photovoltaic module. In FIG. 29, there are shown a photovoltaic module 1, a photovoltaics 1a, and a bypass diode 1b connected parallel to the photovoltaics 1a. When a shadow is partly formed on the photovoltaic module 1 thereby increasing the electrical resistance of the photovoltaics 1a and causing the application of voltage generated in other modules within the string as an inverse bias to the module 1 (hereinafter, referred to as "partial shadow"), the bypass diode 1b prevents the application of an inverse bias to the photovoltaics 1a in the photovoltaic module 1 thereby preventing the damage of the photovoltaic cell. Also, when a photovoltaic module which was part of the photovoltaic module array exhibited abnormal output, it was usually necessary, for detecting the position of the failure, to check whether the electrical output is normal in each string, then to interrupt the operation of the photovoltaics-photovoltaic system and to measure the electrical output of each photovoltaic module constituting the string by utilizing the output terminals of each photovoltaic module.

However, since the output terminals are usually provided on the back surface (a surface opposite to a light incident surface) of the photovoltaic module, it was very difficult to locate a failure position by using the output terminals after the installation of the photovoltaic module. On the other hand, if terminals for inspection are provided in each of the modules in such a way that they are exposed to the exterior, they may cause leakage of electricity or danger of electrical shock, thereby causing reliability problems. For these reasons, terminals for inspection were not provided. Consequently, for locating the failed photovoltaic module in a photovoltaic module array, the current flowed in the wiring of the photovoltaic module array is typically measured utilizing a clamping ampere meter.

It is preferable in practical use to have a photovoltaic module provided with current detecting means not exposed to the exterior in order to locate a failed position. An example of such a photovoltaic module includes the photovoltaic module shown in FIGS. 30A and 30B, as disclosed in the Japanese Patent Application Laid-Open No. 6-125105 and the photovoltaic module shown in FIG. 31, as disclosed in the Japanese Patent Application Laid-Open No. 9-148613.

In FIGS. 30A and 30B, reference characters 1c and 1d indicate magnetic field generating means, and in FIG. 31 reference character 1e indicates light emitting means. In the photovoltaic module shown in FIG. 30A, a current flows in a bypass diode 1b to generate a magnetic field by the magnetic field generating means 1c. The photovoltaic module shown in FIG. 30B is so constructed that by the electromotive force generated by the photovoltaics 1a, an operation current flows into the magnetic field generating means 1d to generate a magnetic field. The photovoltaic module shown in FIG. 31 is so constructed that a current flows into the bypass diode 1b to turn on the light emitting means 1e. The current detecting means shown in FIG. 30B utilizes an operation current c1 generated during the operation of the photovoltaics 1a, while the current detecting means shown in FIGS. 30A and 31 utilize a current c2 flowing into the bypass diode 1b when the voltage of the photovoltaics 1a is lowered.

However, the conventional method of detecting failure of a photovoltaic module array has the following problems. First, when the photovoltaics fails, a current flowing into the bypass diode is generated only when the failure of the photovoltaics is an open circuit failure, and this method cannot be applied to short circuit failure. Second, the failure may not be detected in some cases, depending on the configuration of the photovoltaic module array. This problem becomes more conspicuous when the photovoltaic module array is equipped with a blocking diode for blocking a reverse current.

An open circuit failure means a failure such as an open circuit of the photovoltaic cell itself constituting the photovoltaics, or, in the case of plural photovoltaic cells constituting the photovoltaics, a failure such as breaking of a wiring connecting such photovoltaic cells.

Also, a short circuit failure means a failure such as a short circuit of the photovoltaic cell itself constituting the photovoltaics (including partial short circuit of the photovoltaic cell itself, the same is applied hereinafter), or, in the case of plural photovoltaic cells constituting the photovoltaics, a failure such as the short circuit of the wiring connecting such photovoltaic cells.

Both the open circuit failure and the short circuit failure are modes of failure, and these failure states (modes) are referred to as the open circuit failure mode and the short circuit failure mode, respectively.

The above two problems will be further explained with reference to FIGS. 32A to 34B. FIGS. 32A and 32B show the cases of a short circuit failure of the photovoltaics 1a in the photovoltaic module. In such situation, regardless of the failure state, a current 2 flows into the failure signal generating means D1 for detecting the failure by the "absence" of the operation current of the photovoltaics 1a. On the other hand, even in the case of a failure state, the current 2 does not flow into the failure signal generating means D2 for detecting the failure by the "presence" of the current flowing into the bypass diode 1b. Distinguishing the failure state from the normal state is not possible in either case, and the failed photovoltaic module in the string cannot be detected. FIGS. 33A and 33B show examples of the photovoltaic module array constituted by connecting plural strings in parallel. FIG. 33A shows the state in the normal operation, while FIG. 33B shows the state in the failure state. Reference character 3 indicates a photovoltaic module array, and 3c indicates blocking diodes for preventing loss resulting from the reverse current generated in the case of generating a voltage difference. In such a configuration, when a photovoltaic module 1A constituting a part of a string 3a fails and reaches an open state, the operation current 2 does not flow through the string 3a at all, as shown in FIG. 33B, if the sum of open circuit voltages Voc2+Voc3 generated in other photovoltaic modules 1B and 1C is lower than the sum of operation voltages V4+V5+V6 of the string 3b. In other words, there is obtained a state that a current does not flow into all the bypass diodes and the photovoltaics constituting the string 3a. Consequently, it is not possible to detect the failed photovoltaic module in the string 3a.

FIGS. 34A and 34B are circuit diagrams showing an example of the photovoltaics module array formed by connecting in series a plurality of parallel members 3e of the photovoltaics. FIG. 34A shows the state in the normal operation, while FIG. 34B is an equivalent circuit diagram showing a failure state. In FIG. 34A, I1+I2 indicates the operation current 2 in a normal operation. Even when a photovoltaic module 1D is damaged to generate an open circuit failure as shown in FIG. 34B, if the load current I1'+I2' is not larger than the operation current of the non-failed photovoltaic module 1E, reverse bias is not applied to the failed photovoltaic module 1D at all, so that no current flows into the bypass diode in such module. Consequently, the failure cannot be detected by the type means of detecting the failure by the current flowing into the bypass diode.

It is possible to locate a failure point by detecting the operation current of the photovoltaics by employing the constitution as shown in FIG. 30B. However, since the signal generating means 1d such as the magnetic generating means is connected in series to the photovoltaics, the almost amount of the operation current of the photovoltaics flowed into the signal generating means almost the all amount of the operation current of the signal generating means was not small, and this loss becomes a large value which is not negligible particularly in a large-area photovoltaic module of a large current.

SUMMARY OF THE INVENTION

The present invention has been accomplished in consideration of the above-described problems in the prior art. An object of the present invention is to provide a photovoltaic module, a photovoltaic module array, a photovoltaic system and a method of detecting a failed photovoltaic module, wherein a failure is detected by locating the failed photovoltaic module, regardless of the constitution of the photovoltaic module array and the failure mode of the photovoltaic module.

Namely, a photovoltaic module of the present invention comprises a photovoltaics and a signal generating means for generating a signal by application of a voltage, wherein the photovoltaics and the signal generating means are connected in parallel and the voltage is a voltage outputted by at least the photovoltaics which is connected in parallel with the signal generating means.

The photovoltaic module of the present invention also comprises a photovoltaics and a discrimination means for generating a signal by application of a predetermined voltage, wherein the discrimination means includes a signal generating means for generating a signal in response to a signal generated by the discrimination means, the photovoltaics and the discrimination means are connected in parallel, and the voltage is a voltage outputted by at least the photovoltaics which is connected in parallel with the discrimination means.

The photovoltaic module of the present invention further comprises a photovoltaics and a signal generating means for generating a signal by application of an electrical power, wherein the photovoltaics and the signal generating means are connected in parallel and in series.

The photovoltaic module of the present invention further comprises a photovoltaics and a discrimination means for generating a signal by application of a predetermined electric power, wherein the discrimination means includes a signal generating means for generating a signal in response to a signal generated by the discrimination means, and the photovoltaics and the discrimination means are connected in parallel and in series.

The photovoltaic module comprises a single photovoltaic cell, a string composed of a plurality of photovoltaic cells connected in series, or a parallel member composed of a plurality of the photovoltaic cells connected in parallel (the same meaning of the photovoltaic module is applied hereinafter).

The signal generating means is preferably a light emitting means, a magnetic field generating means, an electric field generating means, a mechanical displacement generating means, a color development means or a combination thereof.

The signal generating means preferably includes a switching means.

The photovoltaic module preferably further comprises a bypass diode; the photovoltaics, the signal generating means and the bypass diode are preferably connected in parallel.

The photovoltaic module is preferably integrated with a construction material.

The photovoltaic module integrated with the construction material preferably further is integrated with a roof panel member.

The signal generating means is preferably provided in the roof panel member.

The photovoltaic module array of the present invention comprises the above photovoltaic module.

In the photovoltaic module array, a wiring for mutually electrically connecting the above photovoltaic modules is preferably provided at a position other than a surface of the photovoltaic module.

The photovoltaic module array preferably comprises a blocking diode.

Further, the photovoltaic system of the present invention comprises the above photovoltaic module array.

Additionally, the method of the present invention of detecting a failed photovoltaic module comprises obtaining information based on at least an operation voltage or power of each photovoltaic module and searching for the presence or absence of failure in each photovoltaic module constituting a photovoltaic module array.

According to the present invention, the signal generating means or the discrimination means can generate a signal by application of a voltage or a power outputted by at least the photovoltaics which is connected in parallel with one of the signal generating means and the discrimination means. Therefore, it is possible to detect a failure, regardless of the failure mode of the photovoltaic module and the constitution of the photovoltaic module array, and to locate the failed cell module. Namely, since a closed circuit is formed by the signal generating means, the discrimination means and the photovoltaics connected in parallel to these means, for example, in the case of generating a failure in a part of the string of the photovoltaic module, the photovoltaics in the closed circuit other than the failed part operate. Therefore, even when the failure is an open circuit failure or a short circuit failure, it is possible to discover failure generation and locate the failed photovoltaic module.

The open circuit failure and the short circuit failure can be also discriminated by the constitution of the signal generating means.

Further, since the signal generating means or the discrimination means is connected in parallel to the photovoltaics (when the photovoltaic module has a bypass diode, since the photovoltaics, the bypass diode and the signal generating means or the discrimination means are connected in parallel), the full amount of operation current does not necessarily flow into the signal generating means or the discrimination means. Therefore, it is possible to remarkably prevent power loss in the signal generating means or the discrimination means.

Furthermore, in the case where no discrimination means is used, the signal generating means analogically generates signals (strong or weak signal). In the case where discrimination means is used in addition to the signal generating means, the discrimination means generates signals by application of a predetermined voltage or power, and the signal generating means generates a signal; and then in response to this signal, the signal generating means generates another signal, namely the signal generating means digitally generates a signal (ON or OFF signal), whereby it is possible to more easily discriminate whether or not the output of a photovoltaic module is good.

Additionally, in order to detect the failed photovoltaic module, the present invention does not utilize the terminals used in the prior art for detecting an output provided at each photovoltaic module, and therefore the reliability of the photovoltaic module of the present invention has been improved in this way.

DESCRIPTION OF THE PREFERRED EMBODIMENTS

[Embodiment 1]

Figure 1A:
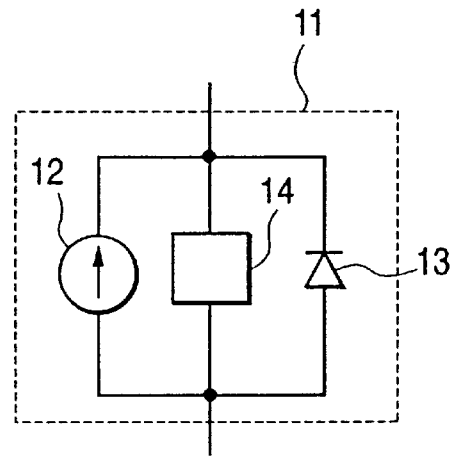
FIGS. 1A and 1B are constitutional diagrams showing one example of a photovoltaic module. of the present invention.
Figure 1B:
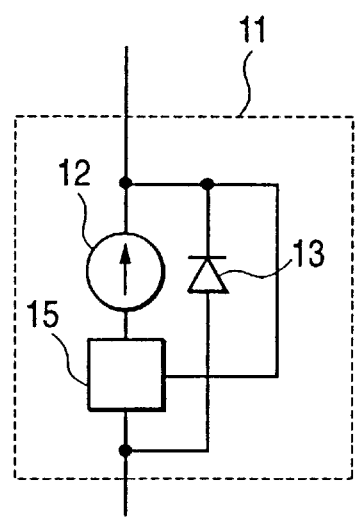

FIG. 1A shows the circuit constitution of a photovoltaic module of the present invention. In FIG. 1A, reference numeral 12 indicates a photovoltaic cell; 13, a bypass diode; and 14, a voltage signal generating means; which are integrally constructed as a photovoltaic module 11. The voltage signal generating means may be replaced by a power signal generating means 15, as shown in FIG. 1B. These components will be explained in the following.

(Voltage Signal Generating Means)

The voltage signal generating means is a signal generating means for generating a signal by application of a voltage. In consideration of the energy loss, the signal generating means preferably is a magnetic field generating means, an electric field generating means, a mechanical displacement generating means, a color development means or a light emitting means. It may output a signal only when light or magnetic field is applied to a specified portion of the photovoltaic module 11, by using a switching means for closing or opening a circuit with light or magnetic field. (The switching means preferably is a lead switch which is operated with a magnetic field.)

Figure 2:
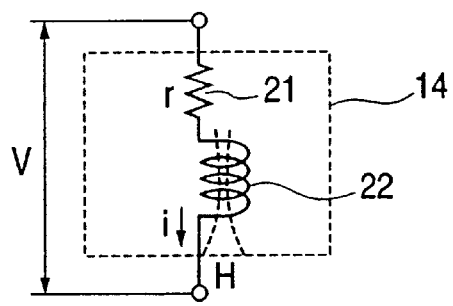
FIG. 2 is a circuit diagram showing one example of a voltage signal generating means for output in a magnetic field form.

FIG. 2 is a circuit diagram showing one example of the voltage signal generating means 14 for output in a magnetic field form. In this case, as the voltage signal generating means 14, a magnetic field generating means is used which is provided with a resistor 21 and a coil 22 for generating a magnetic field. The magnetic field can be measured with a magnetic needle or a Hall element. The resistor 21 may be omitted, but by series connection with the coil 22, it is possible to suppress the amount of a current flowing into the coil 22, thereby further suppressing the power consumption therein. Since it is not necessary to install the magnetic field generating means at a position where the means can be visually confirmed, the magnetic field generating means has excellent features such as ease of installation, easy positive and negative output, or the like.

In the normal operation of the photovoltaics 12 shown in FIGS. 1A and 1B, the voltage outputted therefrom is applied in a direction from the resistor 21 to the coil 22, whereby a current flows in such direction. Thus, the coil 22 generates a magnetic field according to the direction of such current flow. For the purpose of simplicity, the directions of such current and such magnetic field are taken as positive. In the case of an open circuit failure of the photovoltaics 12, there is no output from the photovoltaics 12, so that a current in the negative direction flows in the coil 22 and the bypass diode, whereby a magnetic field of the negative direction is generated. In a complete short failure of the photovoltaics 12, the current scarcely flows in the voltage signal generating means 14 and naturally the coil 22, so that the magnetic field is not generated. In a partial short circuit failure of the photovoltaics 12, a current of the positive direction flows in the coil 22 to generate a magnetic field of the positive direction, which is however weaker than in the case of normal operation of the photovoltaics 12, since the output thereof is lowered in comparison with that in the normal state. It is therefore possible to detect the failure in the photovoltaic module, to locate the failed photovoltaic module and to distinguish the open circuit failure and the short circuit failure.

Figure 3:
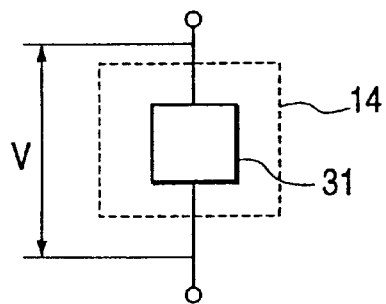
FIG. 3 is a circuit diagram showing one example of a voltage signal generating means for output in a displacement form.

FIG. 3 is a circuit diagram showing an example of the voltage signal generating means 14 for output in a displacement form. In this case, as the voltage signal generating means 14, means for generating a mechanical displacement is used. Reference numeral 31 indicates a piezoelectric element for generating a strain by application of a voltage. As the strain direction of the piezoelectric element depends on the direction of the applied voltage, it is possible, as in the case of the magnetic field generating means explained in FIG. 2, to detect the failure in the photovoltaic module, to search out the failed photovoltaic module and to distinguish the open circuit failure and the short circuit failure, by the strain direction of the piezoelectric element 31. In addition to the direction utilization of the mechanical displacement of the piezoelectric element 31, there may also be internally provided means for amplifying the mechanical displacement. The displacement may also be induced by the repulsive or attractive force of the magnetic field. The generated displacement can be measured by a laser displacement gauge or a strain gauge. In the case of using the mechanical displacement generating means, it has the feature of easily discriminating signals under strong sunlight.

Figure 4:
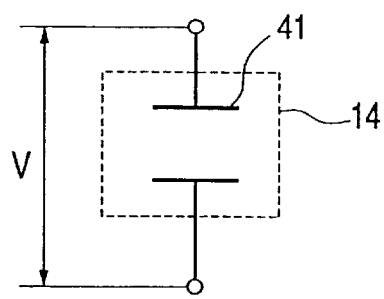
FIG. 4 is a circuit diagram showing one example of a voltage signal generating means for output in an electric field form.

FIG. 4 is a circuit diagram showing one example of the voltage signal generating means 14 for providing output in an electric field form. In this case, as the voltage signal generating means 41, an electric field generating means is used. It is provided with parallel flat plate-shaped electrodes 41. The electric field generated between the electrodes may be directly measured by a known measuring method, or the charge induced between the electrodes is measured, for example, by a surface charge meter. This method utilizing the electric field has an advantage that it is free from energy loss except for the time of measurement.

Figure 5:
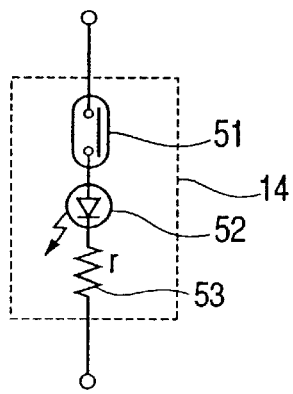
FIG. 5 is a circuit diagram showing one example of a voltage signal generating means for output in a light form.

FIG. 5 is a circuit diagram showing one example of the voltage signal generating means 14 for providing output in a light form. In this case, as the voltage signal generating means 14, a light emitting means is used. It is provided with a lead switch 51, a light emitting diode 52 and a resistor 53. The resistor 53 may be omitted, but by series connection with the light emitting diode 52, it is possible to suppress the amount of current flow in the light emitting diode 52, thereby further suppressing the power consumption in the diode 52. The lead switch 51 can be of a type that is opened or closed by application of an external magnetic field, for example, by a permanent magnet. This voltage signal generating means 14 has an advantage that it is free from energy loss during normal operation, unless the lead switch 51 is actuated by the magnetic field from the outside. Therefore, the voltage signal generating means 14 is advantageously free from energy loss except for the time of detecting failure.

In the normal operation of the photovoltaics 12 shown in FIGS. 1A, 1B and 2, the voltage outputted therefrom is applied in a direction from the lead switch 51 to the resistor 53, whereby a current flows in such direction and the light emitting diode 52 emits a light. For the purpose of simplicity, the direction of such current is taken as positive. In the case of an open circuit failure of the photovoltaics 12, there is no output from the photovoltaics 12; therefore, no current flows in the light emitting diode 52 due to the directional conductivity of the diode, and the light emitting diode 52 does not emit a light, while a current flows in the bypass diode 13. In a complete short circuit failure of the photovoltaics 12, a current scarcely flows in the voltage signal generating means 14 and naturally the light emitting diode 52, and the diode 52 does not emit a light. Also current scarcely flows in the bypass diode 13. In a partial short circuit failure of the photovoltaics 12, a current of the positive direction flows in the light emitting diode 52 by the directional conductivity of the diode, whereby the light emitting diode 52 emits a light. On the other hand, no current flows in the bypass diode 13. The light emission intensity of the light emitting diode 52 is weaker than in the case of normal operation of the photovoltaics 12, since the output of the photovoltaics 12 is lowered in comparison with that in the normal state. It is therefore possible to detect the failure in the photovoltaic module and to locate the failed photovoltaic module. It is also possible to distinguish the open circuit failure and the short circuit failure by employing a light emitting means such as a light emitting diode as the bypass diode 13 or by utilizing the combination of the light emission/turning off of the bypass diode 13 and the light emitting diode 52. In the normal operation of the photovoltaics 12 shown in FIGS. 1A and 1B, the bypass diode does not emit light because no current flows therein by the directional conductivity thereof. On the other hand, the light emitting diode 52 emits a light. In an open circuit failure of the photovoltaics 12, a current flows in the bypass diode 13, and the diode emits a light. On the other hand, the light emitting diode 52 is turned off. In a complete short circuit failure of the photovoltaics 12, a current scarcely flows in the bypass diode 13 so that a light is not emitted. Also the light emitting diode 52 does not emit a light. In a partial short circuit failure of the photovoltaics 12, no current flows in the bypass diode 13, and a light is not emitted therein because of the directional conductivity thereof. The light emitting diode 52 emits a light weaker than in the normal operation state of the photovoltaics 12. It is thus possible to distinguish the open circuit failure and the short circuit failure by employing a light emitting diode as the bypass diode 13.

Figure 33A:
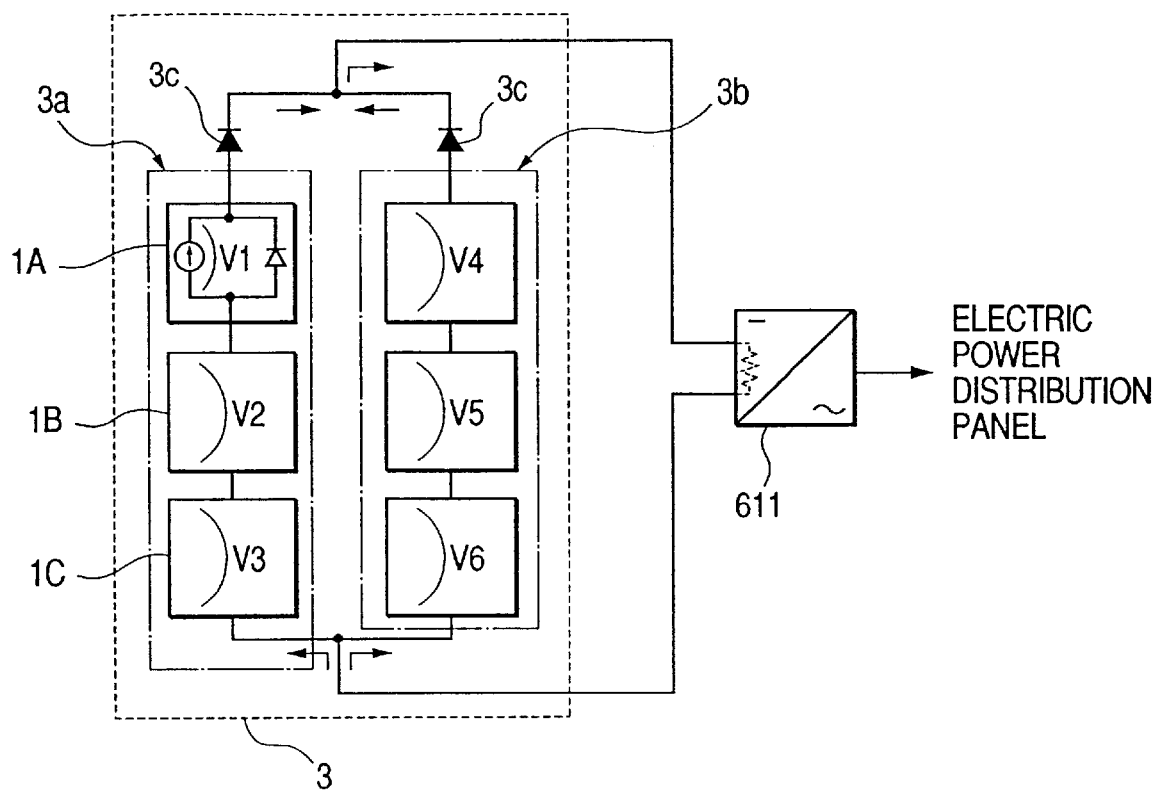
FIGS. 33A and 33B are circuit diagrams showing one example of the photovoltaic module array formed by connecting a plurality of strings of photovoltaic modules in parallel.
Figure 33B:
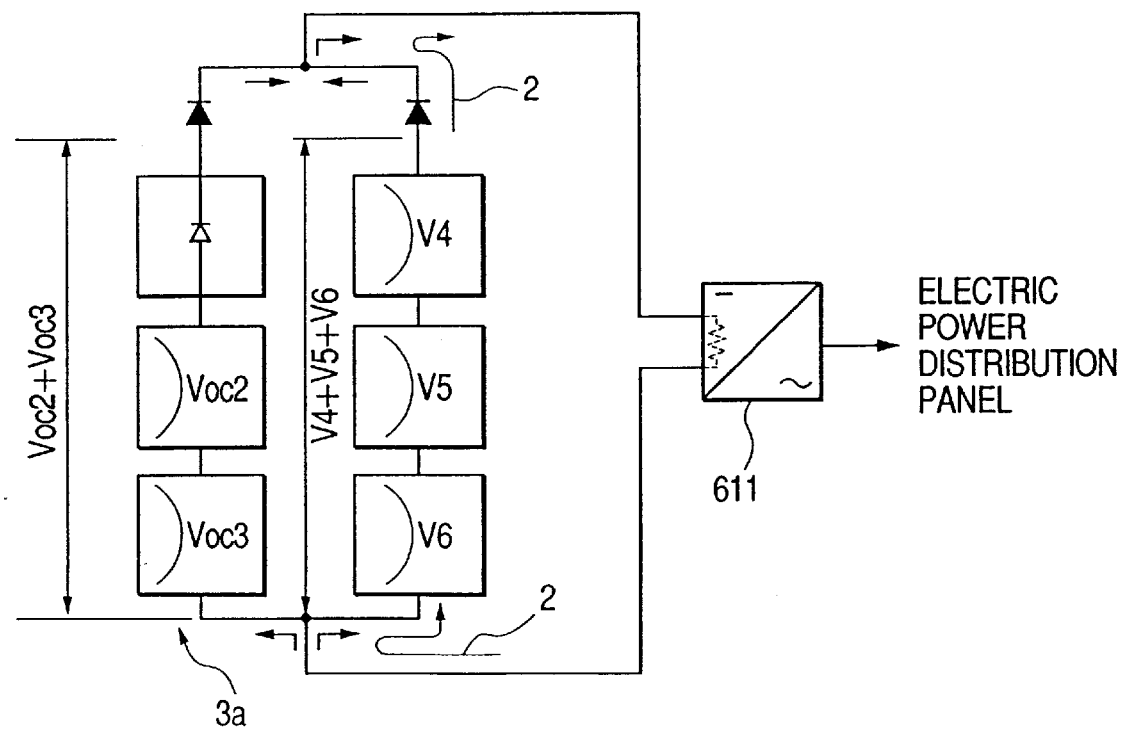
Figure 34A:
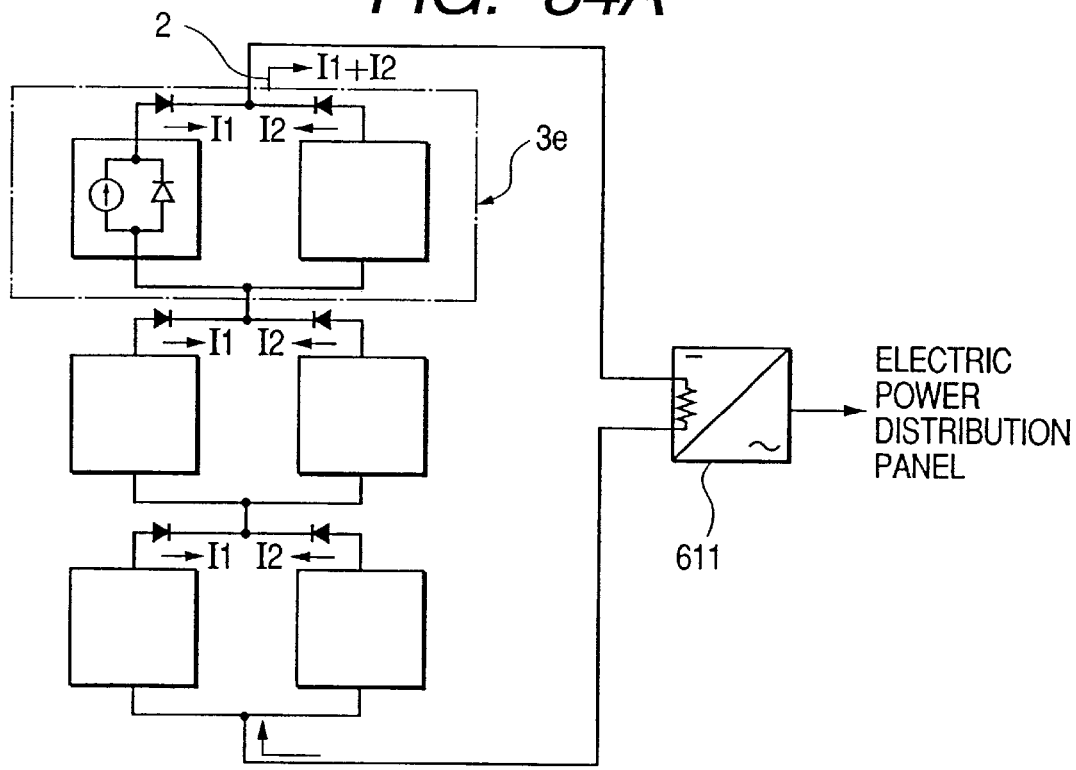
FIGS. 34A and 34B are diagrams showing a constitutional example and function of a photovoltaic module array formed by connecting in series photovoltaic modules connected in parallel.
Figure 34B:
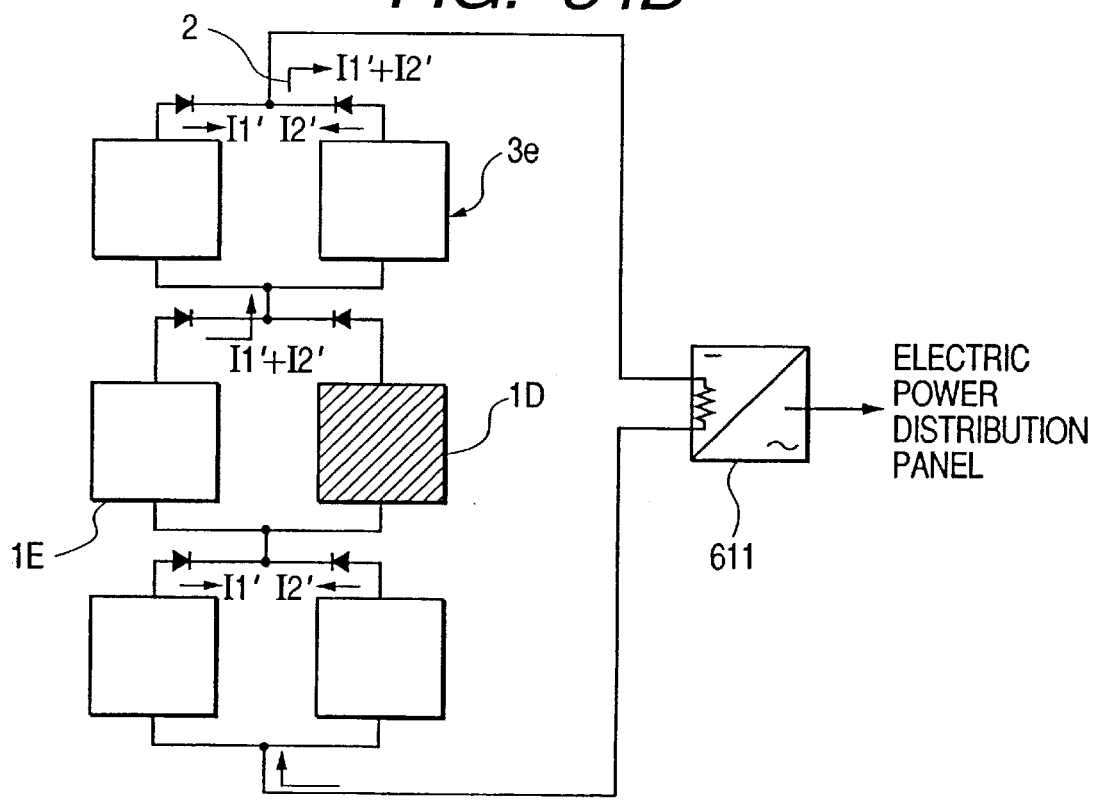

The photovoltaic module of the present embodiment is employed, in place of the photovoltaic module constituting the conventional photovoltaic module arrays shown in FIGS. 33A and 34A, to be able to detect the failure in the photovoltaic module and to locate the failed photovoltaic module, since each photovoltaic module has a closed circuit (formed by the signal generating means and the photovoltaics constituting each photovoltaic module). Specifically, in the case of generating an open circuit failure or a short circuit failure in one of the photovoltaic modules shown in FIG. 33A, the output is still given from the photovoltaics in the closed circuit belonging to the non-failed photovoltaic module, so that the signal generating means connected in parallel to such photovoltaics can operate. It is therefore possible to judge that failure is absent in the photovoltaic module by a signal generated from the signal generating means, and that failure is present in the photovoltaic module by a weak signal or no signal from the signal generating means. Also in the case of generating an open circuit failure or a short circuit failure in one of the photovoltaic modules shown in FIG. 34A, it is possible to detect the failed photovoltaic module in the same manner as the case of applying the photovoltaic module of the present embodiment to the conventional example shown in FIG. 33A, since each photovoltaic module contains the closed circuit.

The voltage signal generating means 14 need not be installed in a specified position of the photovoltaic module, but can be installed, for example, even on the back surface of a photovoltaic cell in the case of the voltage generating means 14 utilizing the magnetic field.

Additionally, as the voltage signal generating means 14, it is possible to use the color development means such as a photochromism element or a liquid crystal element, a color of which can be changed by voltage application. These elements are preferable in the present invention because their consumptive powers are further smaller than that of the light emitting means.

(Power Signal Generating Means)

The power signal generating means is a signal generating means for generating a signal by application of an electric power, and may be means for utilizing the magnetic field of a known electric power meter.

(Bypass Diode)

The bypass diode, 13 may be not only a known, silicon or germanium diode but also a device having a rectifying function composed of selenium and is required to function on a voltage smaller than a reverse bias destructing the photovoltaic cell. With respect to the form, it is not limited to the conventional molded diode. In fact, a diode formed in a part of the photovoltaic cell or a non-molded thin bypass diode has recently been developed. The bypass diode 13 is not necessary in the case where the minimum reverse bias destructing the photovoltaic cell is larger than the reverse bias generated by the partial shadow.

(Photovoltaic Cell)

The photovoltaic cell for constituting the photovoltaics 12 may be one of the known various photovoltaic cells such as single-crystalline, polycrystalline or amorphous. Also there can be employed as a material therefor various semiconductors such as CIS type, CdTe type, GaAs type or Si type semiconductor. The effect of the present invention is more fully exhibited in the case of a thin film photovoltaics, because the failure of the short circuit is easily generated. The photovoltaics 12 may be connected in series or in parallel by a known technology such as laser scribing or interconnector. In this case, the signal generating means, the discrimination means described below and the bypass diode may be provided for each of the photovoltaic cells connected in series or parallel.

(Photovoltaic Module)

The photovoltaic module 11 may be a photovoltaic module not only having the conventionally known superstrate structure or sandwich structure, but also having a recently known structure integrated with a construction material. There is a photovoltaic module having the light entrance surface side also utilizing glass or plastics. The present invention is not limited to a part of such structures, but when the present invention is applied to a photovoltaic module which is installed on an installation surface and which is wired on the back side of the module, since the voltage detection is difficult in such a structure, the effect of the present invention becomes more noticeable. Also, in the field of construction material, it is possible to utilize a block member comprising a plurality of the above-described photovoltaic modules provided on a roof panel member, for example, for pre-fabricated construction. This block member is one embodiment of the photovoltaic module and, for convenience, is referred to as "a roof panel with a photovoltaics" hereinafter.

Figure 6:
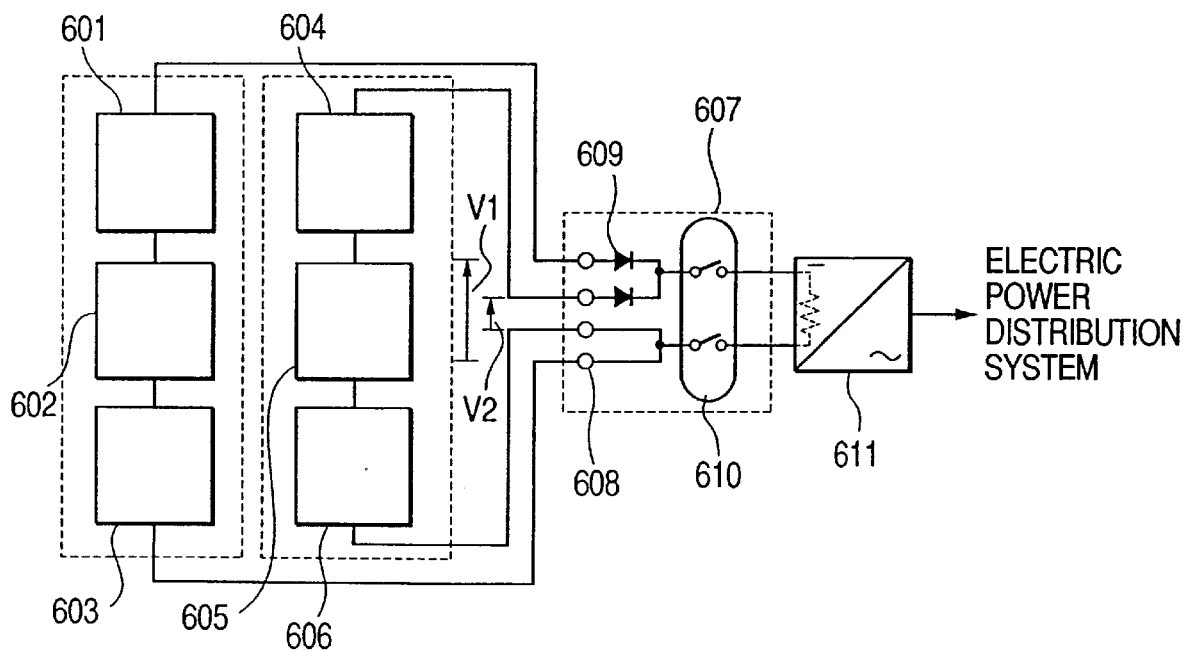
FIG. 6 is an on diagram showing one example of a solar light power generation apparatus employing the photovoltaic module shown in FIGS. 1A and 1B.

FIG. 6 is a block diagram showing one example of a photovoltaic system using the photovoltaic modules described above. Reference numerals 601–606 indicate the above-described photovoltaic modules. The photovoltaic modules 601–603 constitute the first string while the photovoltaic modules 604–606 constitute the second string, and output wirings of these members are guided to a junction box 607 and connected in parallel therein. Reference numeral 608 indicates terminal tables for connecting the wiring of the strings; 609, blocking diodes; 610, a DC switch; and 611, a power control equipment such as an inverter. These components will be explained in the following.

(Blocking Diode)

As the blocking diode 609, an already known high-power diode can be used, preferably with a small on-state resistance. The blocking diode 609 prevents a reverse current flowing in a string of a low potential when a potential difference is generated among the strings constituting the photovoltaic module array, thereby preventing power loss. However, the blocking diode 609 is not an essential component in the present embodiment, and the photovoltaic system having a constitution without the blocking diode 609 can be operated.

(Junction Box)

The strings can also be connected in parallel on the installation surface without employing the junction box 607. But for ease of maintenance, the junction box 607 is provided, for example, in an indoor position and therefore the parallel connection is collectively made therein. The junction box 607 principally contains the terminal tables 608 for fixing the output wirings of the strings, the blocking diodes 609 and the DC switch 610 for turning off the DC output, for the purpose of inspection of the power controlling equipment.

(Inverter)

The inverter 611 is often called a power conditioner or a power control equipment, because it has various functions not only of converting a DC current into an AC current, but also of tracing the maximum power point of the photovoltaics, protecting the connected system, achieving self-controlled operation and the like. Inverters for medium-scale photovoltaic power generation are already in mass production, so that such inverter is available from various suppliers.

In the present embodiment, the photovoltaic module array is formed by parallel connection of the first and second strings through the blocking-diodes 609, but there can be adopted various constitutions for the photovoltaic module array. Also in the photovoltaic system, there can be adopted various constitutions such as the one in which the power controlling equipment is connected to a secondary battery.

In the following there will be explained the procedure of detecting the failure of the photovoltaic module in the case of generating a failure in the photovoltaic system. At first, a string including the failed photovoltaic module is detected by measuring the voltage at the terminals of the junction box 607 with a voltage measuring instrument such as a tester. Then the inspector climbs up to the installation surface. The photovoltaic module is switched to the failure detection mode when it has means for switching to the failure detection mode. Then the failed photovoltaic module is detected with various inspection instruments or by visual observation. In doing so, the present embodiment can significantly reduce the inspection work, because it is not necessary to detach the photovoltaics and expose the output terminals or to extract a part of the wirings. Also the present embodiment can improve the maintainability and reliability of the apparatus, since it can cover various failure modes of the photovoltaic module.

[Embodiment 2]

Figure 7A:
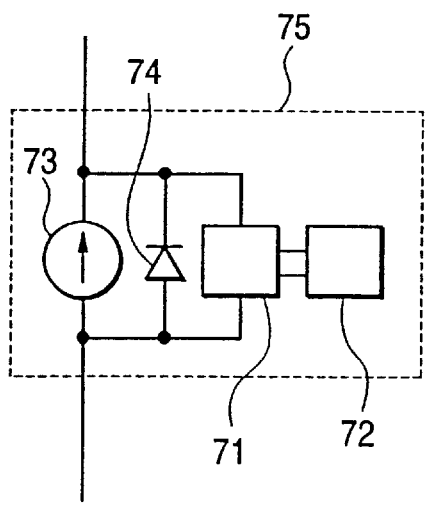
FIGS. 7A and 7B are constitutional diagrams showing one example of a photovoltaic module of the present invention.
Figure 7B:
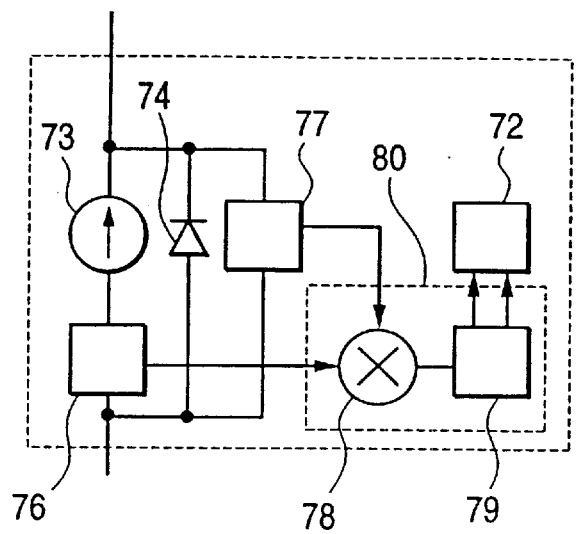

FIG. 7A is a constitutional diagram showing one example of a photovoltaic module of the present invention. In FIG. 7A, reference numeral 73 indicates a photovoltaics; 74, a bypass diode; 71, voltage discrimination means; and 72, signal generating means; which are integrated as a photovoltaic module 75. The voltage discrimination means 71 may be replaced by power discrimination means 80 as shown in FIG. 7B. As the photovoltaic module 75, the photovoltaic cell and the bypass diode 74, the same as those in Embodiment 1 can be used. Other components will be explained in the following.

(Voltage Discrimination Means)

The voltage discrimination means 71 is a discrimination means for generating a signal by application of a predetermined voltage, and preferably has a high input resistance. More specifically, it includes a constant voltage diode, an FET or a MOS semiconductor device utilizing the electric field effect, or an electronic circuit combined with a resistor for realizing a high input resistance.

(Power Discrimination Means)

The power discrimination means 80 is a discrimination means for generating a signal by application of a predetermined electric power. More specifically, it includes a device for calculating the outputs from a current sensor 76 and a voltage sensor 77 with a known semiconductor-based integrated circuit 78. Reference numeral 79 indicates a comparator for judging the result of calculation.

(Signal Generating Means)

The signal generating means 72 is a signal generating means for generating a signal in response to a signal generated by the voltage discrimination means 71 or the power discrimination means 80.

The signal generating means 72 is not particularly limited, but is preferably means driven with a small current. More specifically, it includes a display element utilizing physical properties such as an LED, a photochromic element, an electroluminescent element or a liquid crystal element, or a mechanical display element utilizing a piezoelectric element or electromagnetic force of a magnet and a coil.

In the following there will be given a detailed explanation on the voltage discrimination means 71 and the signal generating means 72.

Figure 8:
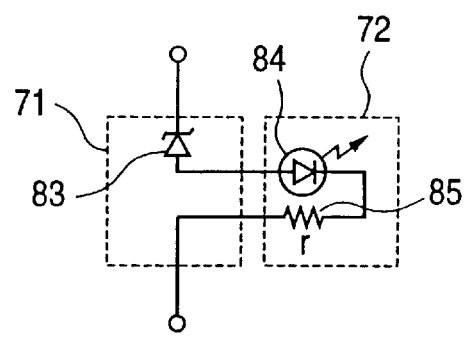
FIG. 8 is a circuit diagram showing one example of a voltage discrimination means with a constant voltage diode.

FIG. 8 shows an example employing a reference diode 83 as the voltage discrimination means 71 and a resistor 85 and a light emitting diode 84 as the signal generating means, which is realized in a simple constitution. The resistor 85 may be omitted, but by series connection with the light emitting diode 84, it is possible to suppress the amount of a current flowing therein, thereby further suppressing the power consumption therein. In the operation state of the photovoltaics 73 shown in FIG. 7A, the voltage outputted therefrom is applied in a direction from the light emitting diode 84 to the resistor 85. This direction is taken as positive. The reference diode 83 is so selected as to have a Zenar voltage smaller than the voltage applied to the reference diode 83 in the positive direction under the normal operation state of the photovoltaics 73. Thus, in the normal operation state of the photovoltaics 73, a current flows in the reference diode 83, thereby causing the light emitting diode 84 to emit a light. In a partial short circuit failure of the photovoltaics 73, the output of the photovoltaics 73 becomes smaller than in the normal operation state. Thus, when the voltage applied to the reference diode 83 becomes smaller than the Zenar voltage thereof, the light emitting diode 84 is turned off. In contrast to the signal generating means shown in FIG. 5, which functions in an analog manner, the present embodiment provides a digital function because the failure is detected by the on/off state of the light emitting diode 84. In this manner, it is possible to easily judge whether the output of the photovoltaic module is satisfactory or not. Except for the above point, the method of detecting the failure of the photovoltaic module and locating the failed photovoltaic module is similar to that explained in relation to FIG. 5. It is also possible, as explained in relation to FIG. 5, to distinguish the open circuit failure and the partial short circuit failure by employing a light emitting diode or the like as the bypass diode 74.

Figure 9:
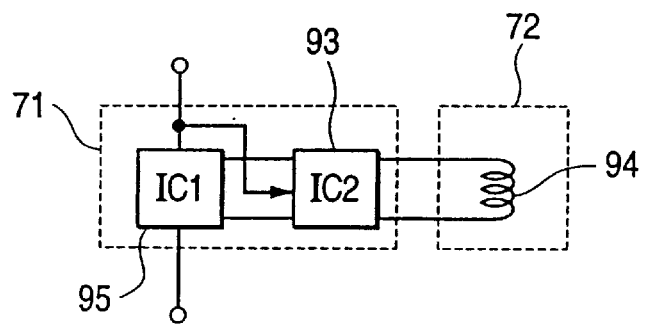
FIG. 9 is a circuit diagram showing one example of a voltage discrimination means with an integrated circuit.

FIG. 9 shows an example employing an integrated circuit formed by the known CMOS process. The integrated circuit formed by the CMOS process exhibits low power consumption. The signal generating means 72 is composed of a magnetic field generating coil 94, while the voltage discrimination means 71 is composed of a reference voltage generation means 95 and a comparator 93. The power for the integrated circuit is supplied from a detecting power source. When a normal voltage is generated, a current is supplied to the coil 94 to generate a magnetic field. Though FIG. 9 illustrates the use of plural integrated circuits, it is naturally possible to realize the circuit with a single integrated circuit.

Figure 10:
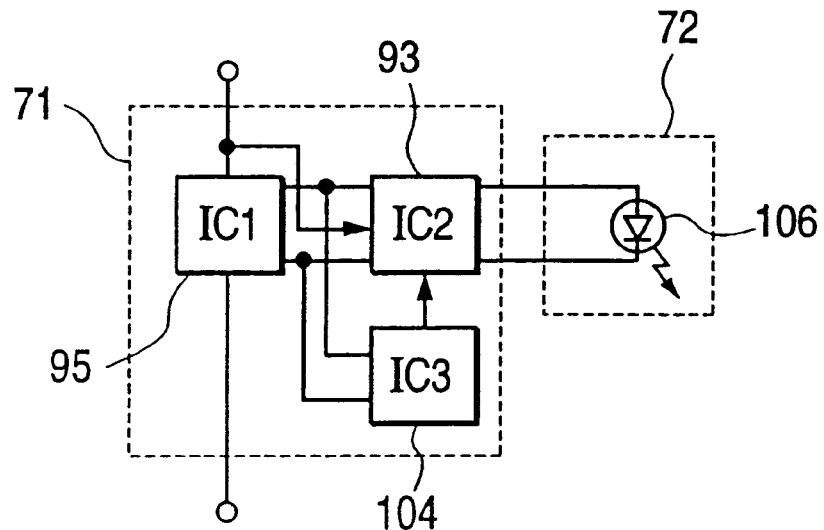
FIG. 10 is a circuit diagram showing one example of a voltage discrimination means with a timer and a sensor.

FIG. 10 shows one example in which control means 104 composed of a timer or a sensor is added to the constitution shown in FIG. 9. In this constitution, it is possible to reduce the energy consumed in the signal generating means 72 by intermittently turning on a light emitting diode 106 therein of the signal generating means 72, in addition, and to provide a failure detection mode by employing a sensor as the control means 104, and to suppress the energy loss by stopping the power supply to the signal generation means 72, except for the time of setting the failure detection mode.

Figure 11:
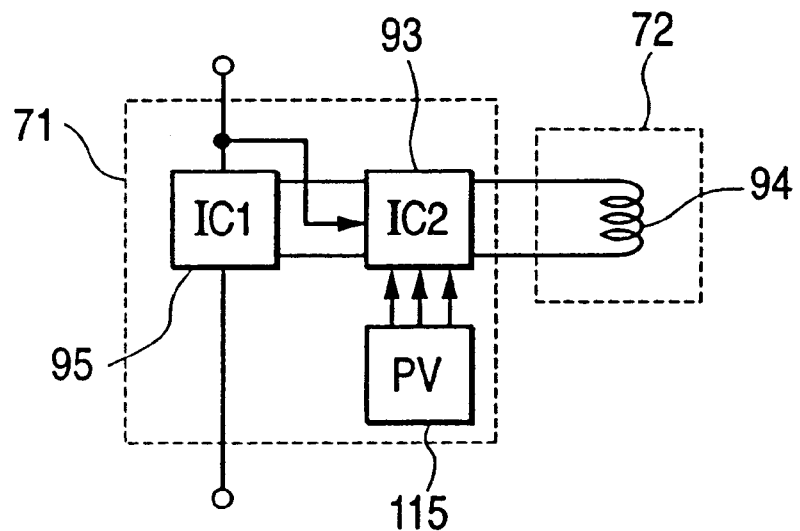
FIG. 11 is a circuit diagram showing one example of a voltage discrimination means with another energy source.

FIG. 11 shows one example in which an external power supply means 115 is added to the constitution shown in FIG. 9. In this constitution, it is possible to activate the signal generating means 72 by the external power supply means 115 only in the failed state of the photovoltaic module, thereby preventing the energy loss in the ordinary operation state. As the external power supply means 115, it is possible to use an additional photovoltaics provided for the signal generating means or another external power source.

When the photovoltaic module of the present embodiment is used in place of the photovoltaic module constituting the conventional photovoltaic module arrays shown in FIGS. 33A and 34A, it is possible to detect the failure in the photovoltaic module and to locate the failed photovoltaic module, since each photovoltaic module has a closed circuit (composed of the discrimination means and the photovoltaics constituting each photovoltaic module). Specifically, even when an open circuit failure or a partial short circuit failure occurs in one of the photovoltaic modules shown in FIG. 33A, the output is still given from the photovoltaics in the closed circuit belonging to the non-failed photovoltaic module, so that the discrimination means and the signal generating means connected in parallel to each photovoltaics can execute the functions thereof. It is therefore possible to judge that failure is absent in the photovoltaic module of which the signal generating means generates a signal, and that failure is present in the photovoltaic module in which the signal from the signal generating means is absent or weak. Also even when an open circuit failure or a partial short circuit failure occurs in one of the photovoltaic modules shown in FIG. 34A, it is possible to detect the failed photovoltaic module in the same manner as the case of applying the photovoltaic module of the present embodiment to the conventional constitution shown in FIG. 33A, since each photovoltaic module has the closed circuit.

Accordingly, it is possible to constitute the photovoltaic module array or the photovoltaic system in the same manner as Embodiment 1 and to realize the detection of the failed photovoltaic module by the same process. Therefore, also the present embodiment can significantly reduce the inspection work, because it is not necessary to detach the photovoltaics and expose the output terminals or to extract a part of the wirings. Also the present embodiment can improve the reliability of the apparatus, since it can cover various failure modes of the photovoltaic modules.

In the following, the present invention will be clarified further by examples of a photovoltaic module constitution, a photovoltaic module array constitution or a photovoltaic system in a specific manner.

EXAMPLE 1

Figure 12A:
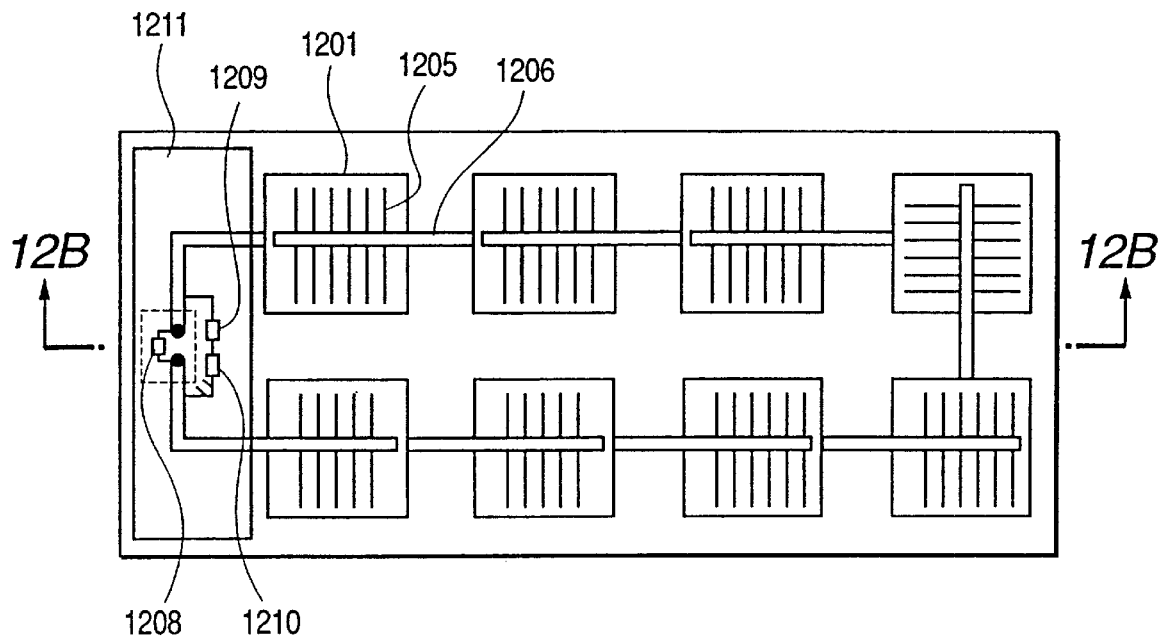
FIG. 12A is a plan view showing a photovoltaic module of the present invention.
Figure 12B:
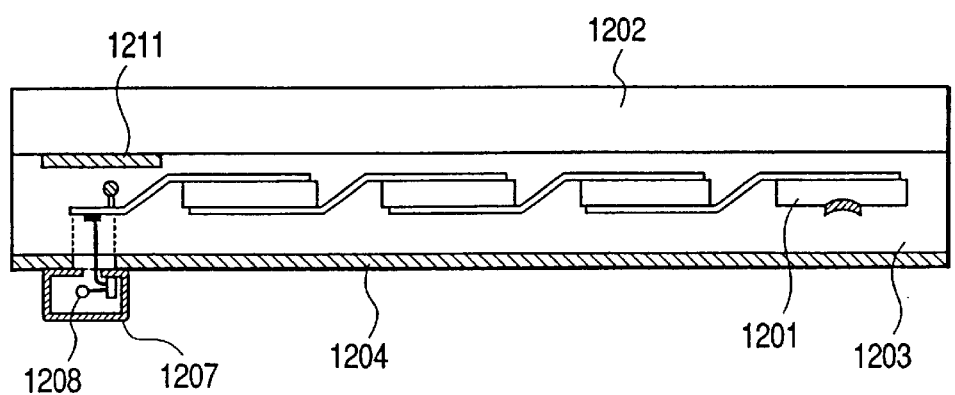
FIG. 12B is a schematically perspective view from the cross section taken along the line 12B—12B in FIG. 12A, wherein constitutional members observable from the cross section are schematically represented.
Figure 13:
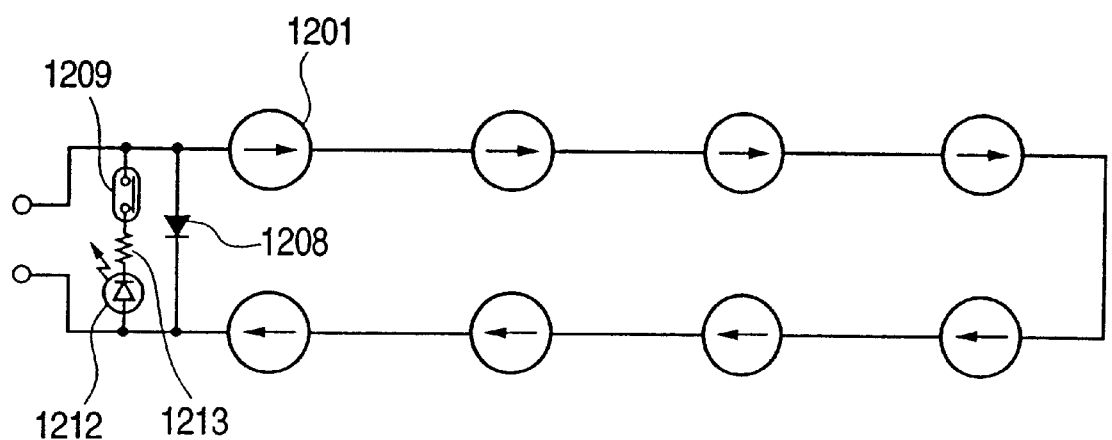
FIG. 13 is a circuit diagram of the photovoltaic module shown in FIGS. 12A and 12B.

FIGS. 12A, 12B and 13 are a plan view, a schematically perspective view and a circuit diagram, respectively, showing a photovoltaic module of the present invention. Specifically, FIG. 12A is a plan view showing the structure of a photovoltaic module of the so-called superstrate structure. FIG. 12B is a schematically perspective view from the cross section taken along the line 12B—12B in FIG. 12A. FIGS. 12A and 12B show polycrystalline photovoltaic cells 1201, a protective glass 1202, silicone resin 1203, and a moisture preventing film 1204 consisting of a laminated Tedlar/aluminum foil/Tedlar film. Known vacuum laminating technology can be applied for sealing these materials, thereby easily sealing the photovoltaic cell 1201 for forming the module. In consideration of the external appearance, the color of the Tedlar film was selected as blue in order to match the color of the polycrystalline photovoltaic cell. On the surface of the photovoltaic cell 1201, there is formed a current collecting electrode 1205, and the photovoltaic cells 1201 are connected in series by an interconnector 1206 as shown in FIG. 13 and are guided to an output terminal box 1207 by which the electrical output is taken out to the exterior.

A bypass diode 1208 for protecting the photovoltaic cells 1201 is provided in the output terminal box 1207 in this example. There are also provided a lead switch 1209 which is turned on by application of a magnetic field from the exterior, and a voltage signal generating means 1210 consisting of a light emitting diode 1212 and a resistor 1213. A dark-colored masking film 1211 is provided, so that the light of the light emitting diode 1212 can be confirmed even in the daylight.

In the case of detecting the failed photovoltaic module, the inspection is executed by applying a magnetic field, for example, with a permanent magnet, to the lead switch 1209 of each installed photovoltaic module. The photovoltaic module is judged normal when the light emitting diode 1212 is turned on by application of the magnetic field. The photovoltaic module is detected as in failure when the light-emitting amount is smaller than that in an ordinary turn-on state or the light emitting diode 1212 is not turned on. Each photovoltaic module is completely free from electric power consumption in the normal operating state without the application of the magnetic field. Each photovoltaic module can be installed by conventionally known various installing methods.

EXAMPLE 2

Figure 15:
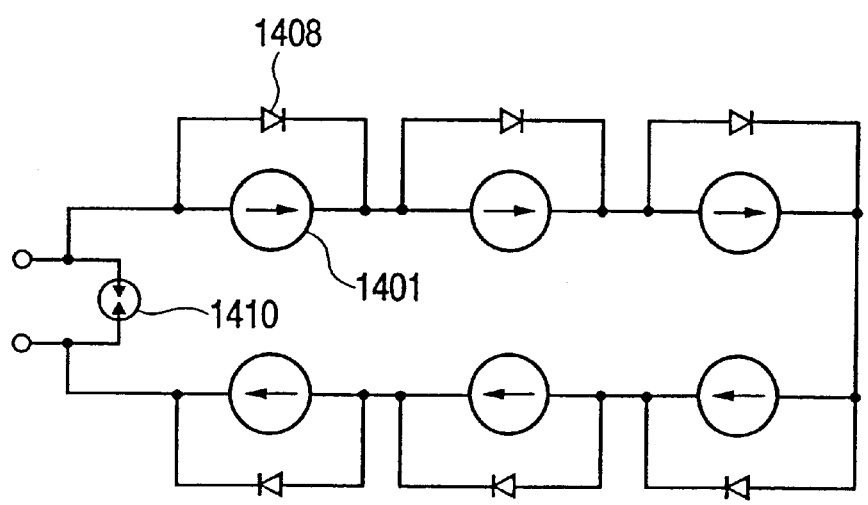
FIG. 15 is a circuit diagram of the photovoltaic module shown in FIGS. 14A, 14B and 14C.
Figure 14A:
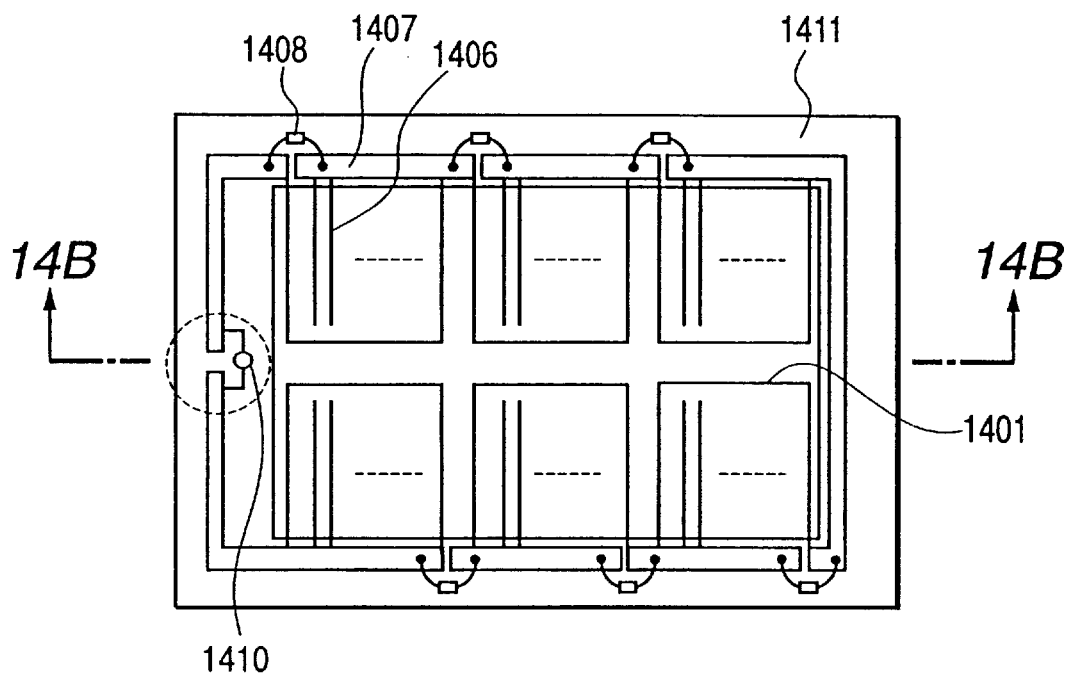
FIG. 14A is a plan view showing one example of a photovoltaic module of the present invention.
Figure 14B:
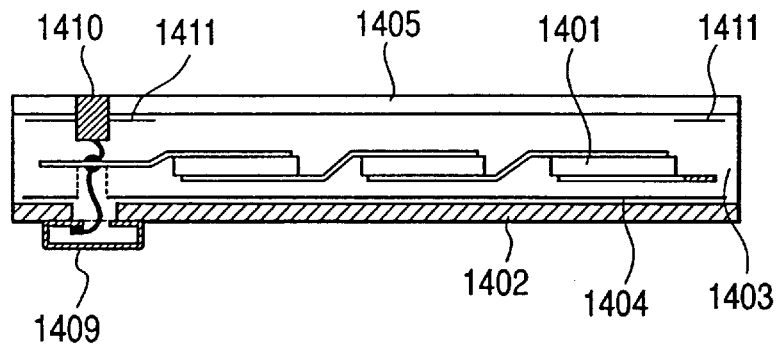
FIG. 14B is a schematically perspective view from the cross section taken along the line 14B—14B in FIG. 14A, wherein constitutional members observable from the cross section are represented.

FIGS. 14A, 14B and 15 show a photovoltaic module of the present invention. FIGS. 14A and 14B are respectively a plan view and a cross-sectional view showing the representative example of a photovoltaic module having the so-called substrate structure. FIGS. 14A and 14B show amorphous photovoltaic cells 1401, a reinforcing plate 1402, a sealing resin 1403 consisting of a mixture of EVA (ethylene vinyl acetate) resin and a non-woven glass cloth, a transparent polyethylene film 1404 for insulation between the painted steel plate 1402 and the photovoltaic cell 1401, a black polyethylene film 1411 for concealing a non-power-generating area such as of an interconnector and a diode, and a transparent fluororesin film 1405 for surface protection.

This photovoltaic module can be also prepared by sealing the photovoltaic cells 1401 with the known laminating technology.

On the surface of the photovoltaic cell 1401, there is formed a current collecting electrode 1406, and the photovoltaic cells 1401 are connected in series by an interconnector 1407 as shown in the circuit diagram of FIG. 15 and are guided to an output terminal box 1409 by which the electrical output is taken out to the exterior.

Figure 14C:
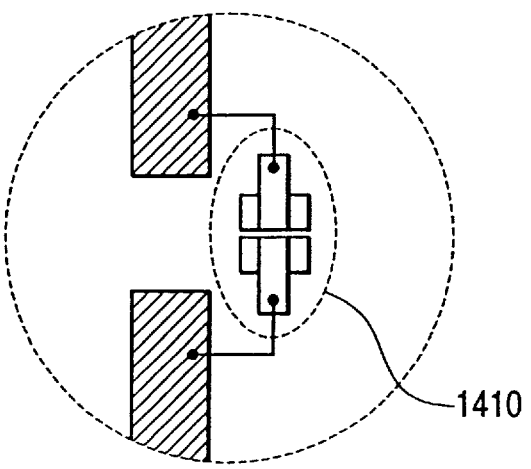
FIG. 14C is a partial view within a circle in FIG. 14A.

A bypass diode 1408 for protecting the photovoltaic cells 1401 is provided, in this example, for each of the elements 1401. Parallel flat plate-shaped electrodes 1410 are provided for concentrating the electric field and displaying the voltage by such electric field. FIG. 14C is a magnified partial view of the parallel plate-shaped electrodes 1410. The electric field can be read for example by a surface charge measuring device for reading the charge accumulated in a space applied with an electric field or a device for reading a dielectric member such as sealing resin distorted by an electric field by a laser beam.

This photovoltaic module is advantageous in that it is completely free from electric power consumption during normal operation. Also, conventionally known installing methods can be applied to this example.

EXAMPLE 3

Figure 16A:
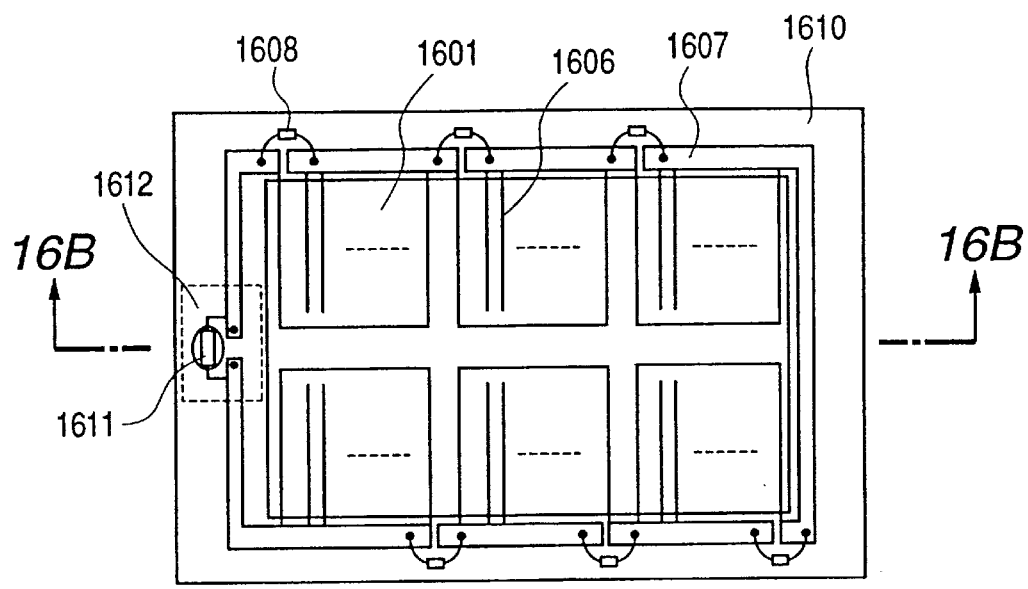
FIG. 16A is a plan view showing one example of the photovoltaic module of the present invention.
Figure 16B:
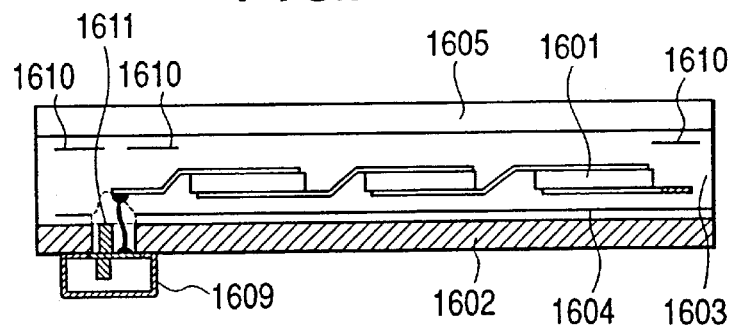
FIG. 16B is a schematically perspective view from the cross section taken along the line 16B—16B in FIG. 16A, wherein constitutional members observable from the cross section are schematically represented.

FIGS. 16A and 16B to 21 show one example of the photovoltaic module of the present invention. FIG. 16A is a plan view showing a construction material-integrated photovoltaic module having a substrate constitution according to the present example. FIG. 16B is a schematically perspective view from the cross section taken along the line 16B—16B in FIG. 16A. FIGS. 16A and 16B show amorphous photovoltaic cells 1601, a painted construction steel plate 1602, sealing resin 1603 consisting of a mixture of EVA (ethylene vinyl acetate) resin and non-woven glass cloth, a polyethylene film 1604 for insulation between the painted steel plate 1602 and the photovoltaic cell 1601, and a transparent fluororesin film 1605 for surface protection. This photovoltaic module can be also formed by sealing the photovoltaic cells 1601 with known laminating technology.

Figure 17:
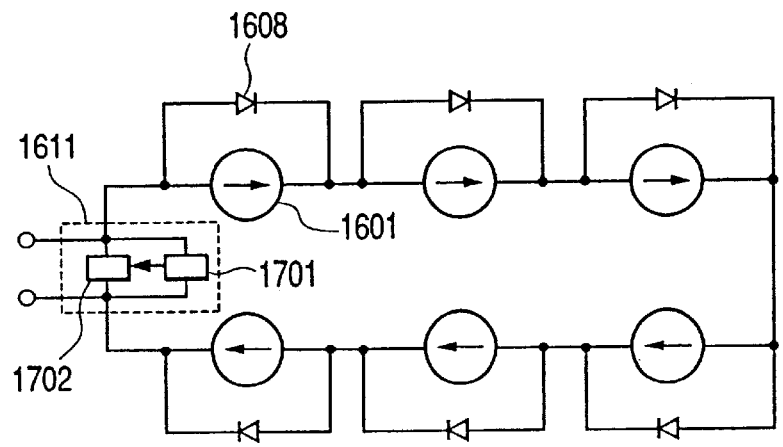
FIG. 17 is a circuit diagram of the photovoltaic module shown in FIGS. 16A and 16B.

A current collecting electrode 1606 is formed on the surface of the photovoltaic cell 1601, and the photovoltaic cells 1601 are connected in series by an interconnector 1607 as shown in the circuit diagram of FIG. 17 and are guided to an output terminal box 1609 by which the electrical output is taken out to the exterior.

One bypass diode 1608 for protecting the photovoltaic cells 1601 is provided, in this example, for each element 1601. A black polyethylene film 1610 is provided for concealing the non-power-generating area and is provided with a hole 1612 for exposing a voltage detection block 1611. As shown in the circuit diagram of FIG. 17, the voltage detection block 1611 is an integral unit containing a voltage discrimination means 1701 and a voltage signal generation means 1702, and in this example, an integral unit containing an integrated semiconductor circuit and a display device is used.

Figure 18:
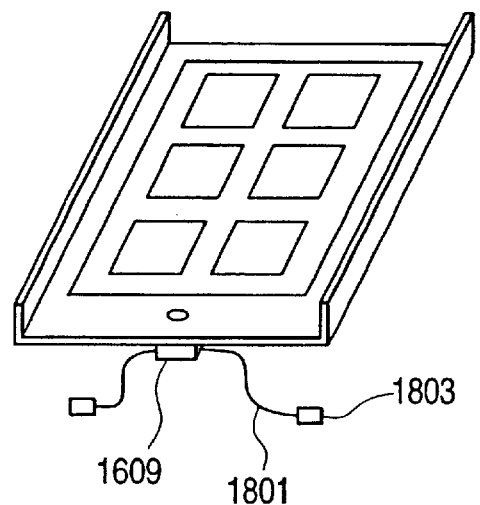
FIG. 18 is a perspective view of a photovoltaic module integrated with a construction material which is formed by using the module shown in FIGS. 16A and 16B.

FIG. 18 is a perspective view showing one example in which the flat panel type photovoltaic module integrated with the construction material shown in FIGS. 16A and 16B is formed into a ribbed seam roof member. FIG. 18 shows a lead wire 1801 for taking out the electrical output of each photovoltaic module from an output terminal box 1609, and a connector 1803 for interconnecting the photovoltaic modules by a single action.

Figure 19:
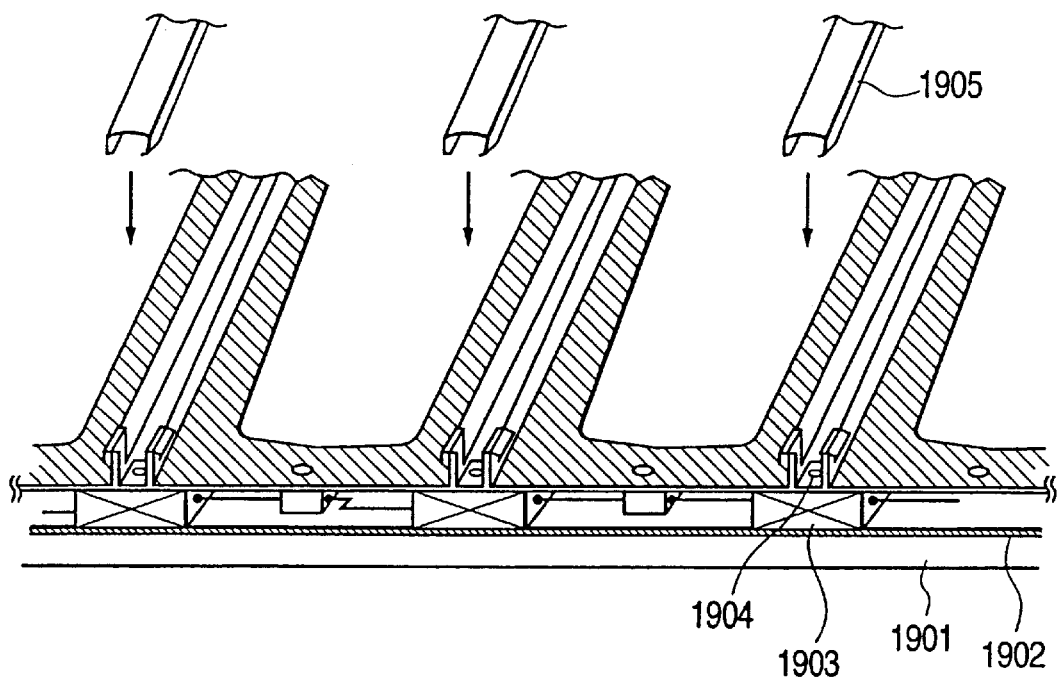
FIG. 19 is a cross-sectional view showing the state of installation of the photovoltaic module shown in FIG. 18.
Figure 20:
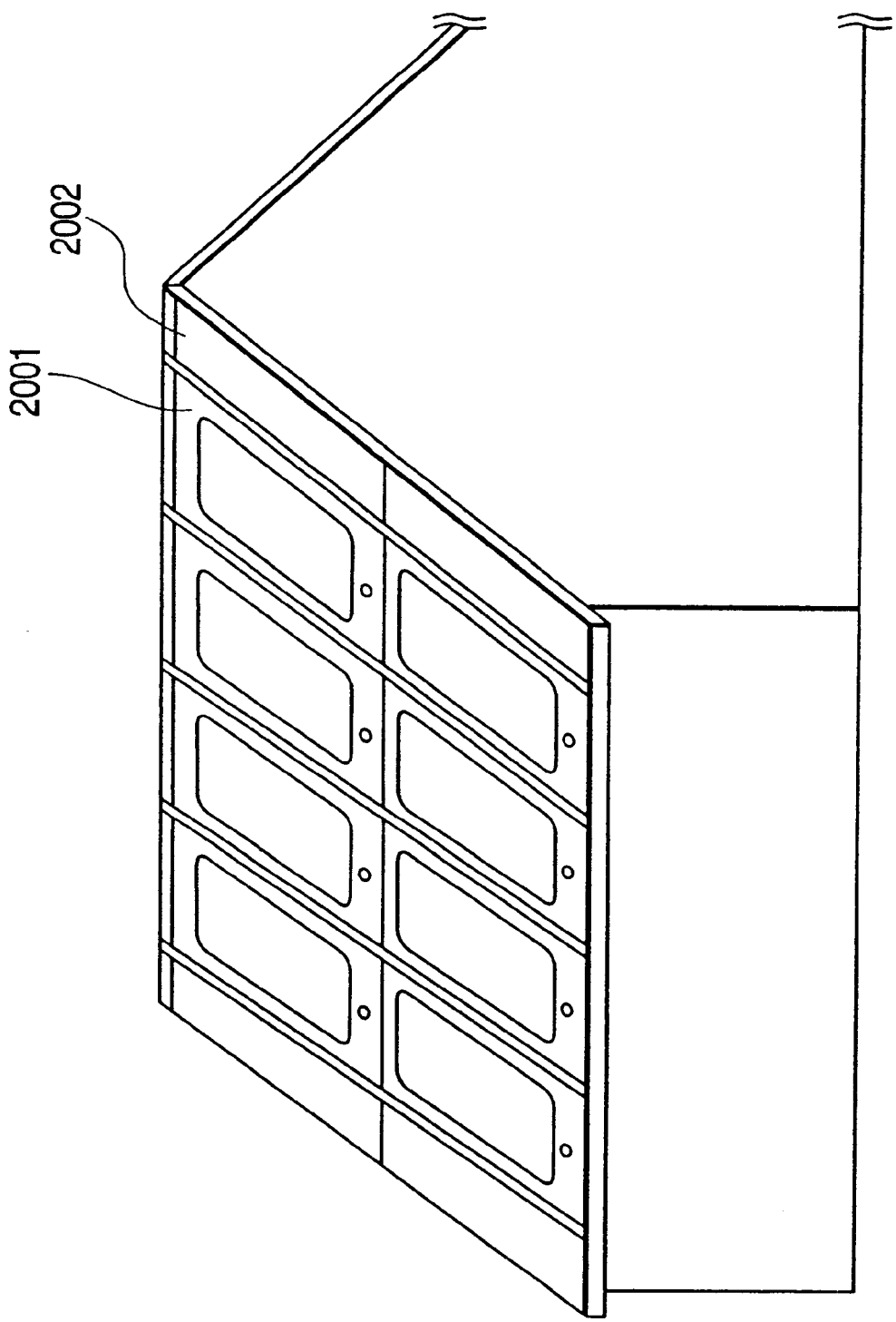
FIG. 20 is a view showing the state of installing the photovoltaic module, shown in FIG. 18 on a roof surface.
Figure 21:
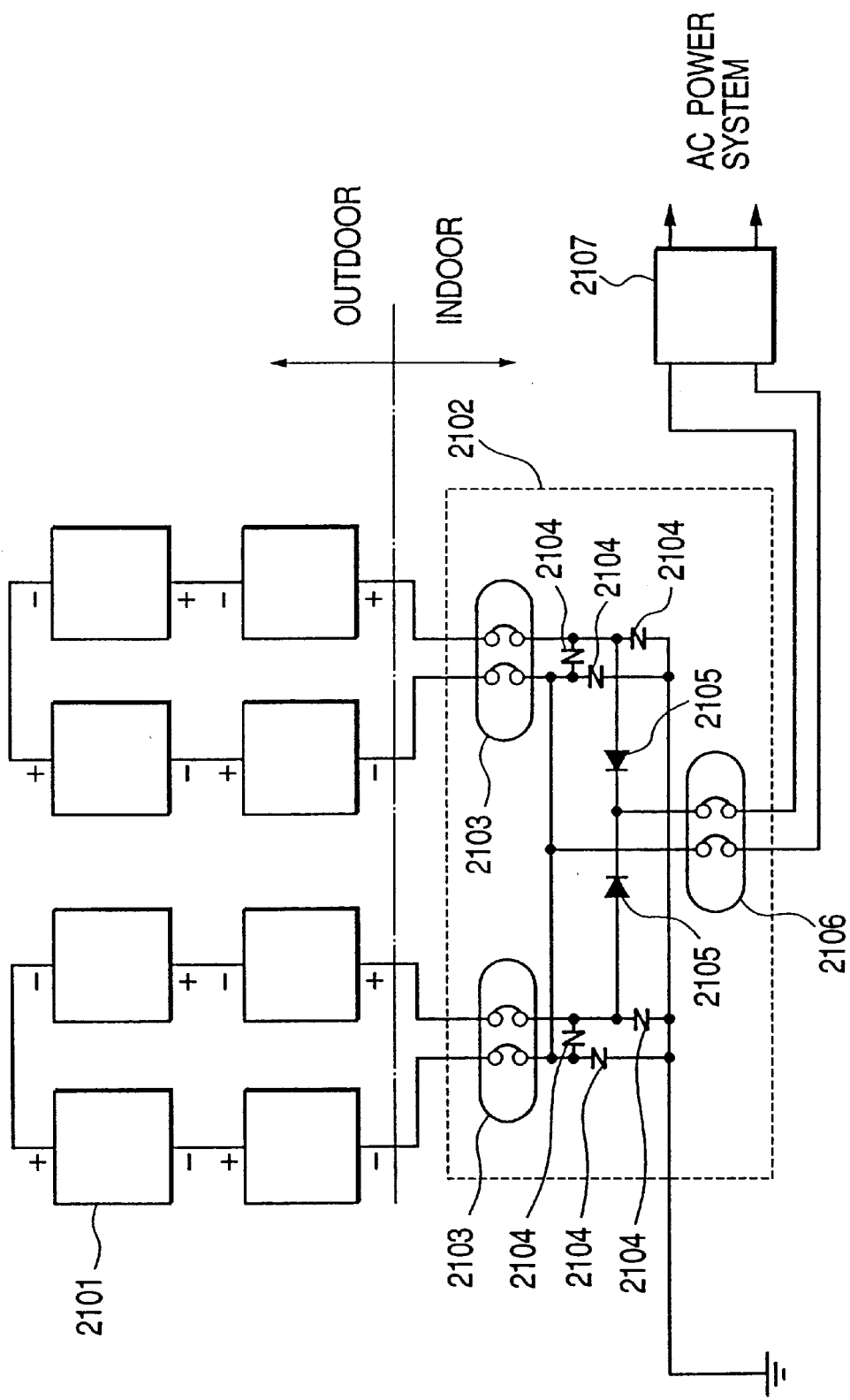
FIG. 21 is a block diagram showing the constitution of a solar power generation apparatus composed of the photovoltaic module shown in FIG. 18.

FIG. 19 is a cross-sectional view showing the case where a ribbed seam roof member integrated with the photovoltaic modules are installed on the roof. FIG. 19 shows a sheathing roof board 1901, a water-repellent sheet 1902, and a batten 1903 for forming a wiring space between the photovoltaics and the roof board. The photovoltaic modules are connected in this space to form strings as shown in FIG. 21, which are connected in parallel in an indoor junction box 2102. The photovoltaic modules are fixed to the batten 1903 with a two sides-fixing clip, and capping members 1905 are placed thereon to prevent rain damage. FIG. 20 shows one example in which the ribbed seam roof members integrated with the photovoltaic modules are installed on the surface of a gable roof. FIG. 20 also shows a ribbed seam roof member 2001 integrated with the photovoltaic module and ordinary roof materials 2002, which are used for forming the end portions of the roof and for regulating the standard power generation capacity of the photovoltaic system.

FIG. 21 is a block diagram of the thus constructed photovoltaic system. FIG. 21 shows photovoltaic modules 2101, a junction box 2102, DC switches 2103 provided at the side of the photovoltaic modules and used for disconnecting the photovoltaic modules 2101 at the time of replacement thereof, arresters 2104 for preventing destruction of the apparatus by lightening, blocking diodes 2105, a DC switch 2106 to be used in the case of inspection of the power control equipment, and a power control equipment 2107 by which the present photovoltaic system is connected to an external system to form a reverse current system.

In the following there will be explained, with reference to FIG. 21, the method of identifying the failed photovoltaic module. At first, in the daytime, there is measured the terminal voltage at the input side of the DC switch 2103. As the failure of a photovoltaic module results in a decrease in the terminal voltage, the position of the failed module can be predicted by locating the string with a lowered voltage. Then the inspector climbs up to the installation surface and confirms, by visual observation, the display unit of the photovoltaic module which is assumed to have failed. So, the failed module can be located. In this time, it is necessary to confirm that the photovoltaic modules are free from the partial shadow phenomenon.

Although the installation of the photovoltaics on the roof and the maintenance thereof are expensive, this example can facilitate the maintenance work since the failed photovoltaic module can be easily located. It is therefore possible to maintain the photovoltaic system in an inexpensive manner. Also high reliability can be realized since the failure detection means is incorporated into the roof member. There is furthermore provided an advantage of easy installation, since particular wiring work is not required for failure detection.

EXAMPLE 4

Figure 22A:
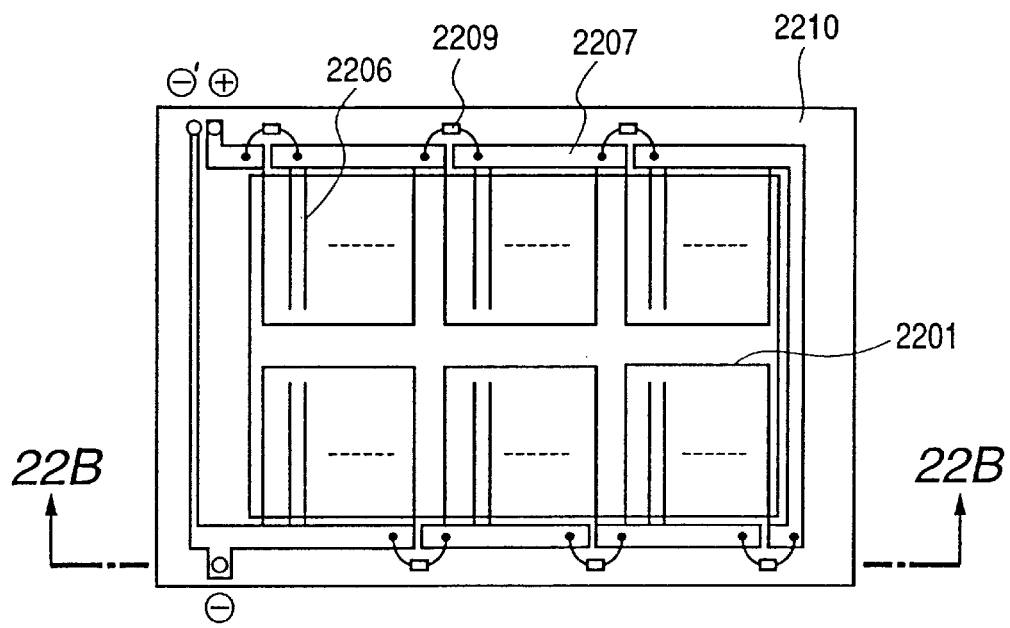
FIG. 22A is a plan view showing one example of the photovoltaic module of the present invention.
Figure 22B:
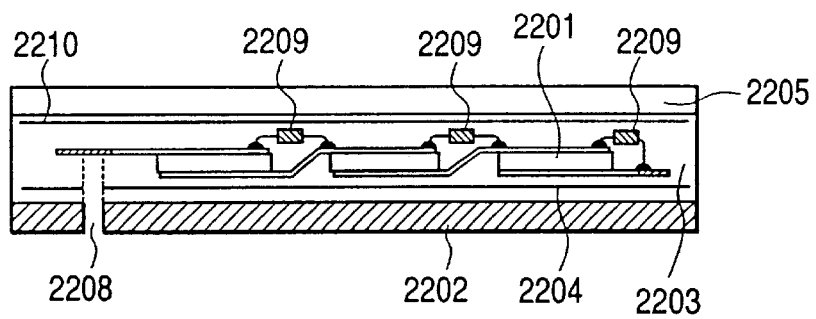
FIG. 22B is a schematically perspective view from the cross section taken along the line 22B—22B in FIG. 22A, wherein constitutional members observable from the cross section are represented.

FIGS. 22A and 22B to 28 show one example of the photovoltaic module of the present invention. FIG. 22A is a plan view showing one example of a photovoltaic module integrated with a construction material having a substrate structure. FIG. 22B is a schematic perspective view from the cross section taken along the line 22B—22B in FIG. 22A. FIGS. 22A and 22B show amorphous photovoltaic cells 2201, a reinforcing painted steel plate 2202, sealing resin 2203 consisting of a mixture of EVA (ethylene vinyl acetate) resin and non-woven glass cloth, a polyethylene film 2204 for insulation between the painted steel plate 2202 and the photovoltaic cells 2201, and a transparent fluororesin film 2205 for surface protection. This photovoltaic module can be also formed by sealing the photovoltaic cells with known laminating technology.

Figure 23:
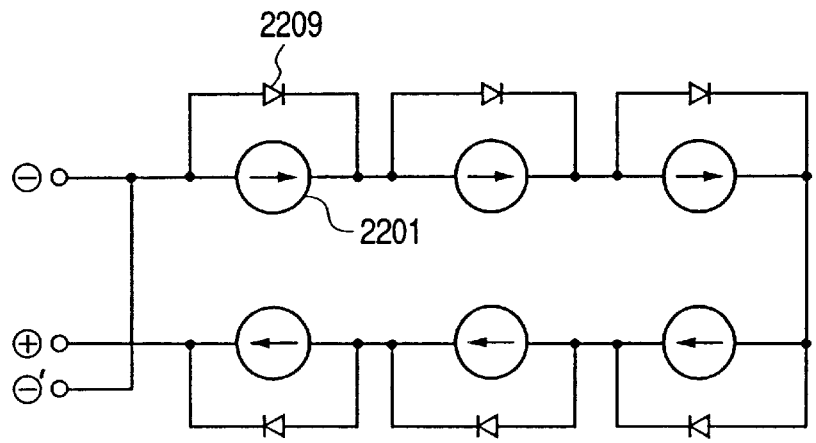
FIG. 23 is a circuit diagram of the photovoltaic module shown in FIGS. 22A and 22B.

On the surface of the amorphous photovoltaic cell 2201, there is formed a current collecting electrode 2206, and the amorphous photovoltaic cells 2201 are connected in series by an interconnector 2207 as shown in the circuit diagram of FIG. 23 and are guided to an output terminal box 2209. The electrical output is taken out from apertures 2208 of the painted steel plate 2202. Each photovoltaic module is provided, at the ends thereof, with two apertures 2208 for plus terminals and an aperture 2208 for minus terminal. In this example, a bypass diode 2209 for protecting the amorphous photovoltaic cells 2201 is provided for each element 2201. A black polyethylene film 2210 is provided for concealing the non-power-generating area. An advantageous feature of this example resides in that the above-described photovoltaic module integrated with the construction material is used as a roof panel as one embodiment of the photovoltaic module shown in FIG. 24.

Figure 24:
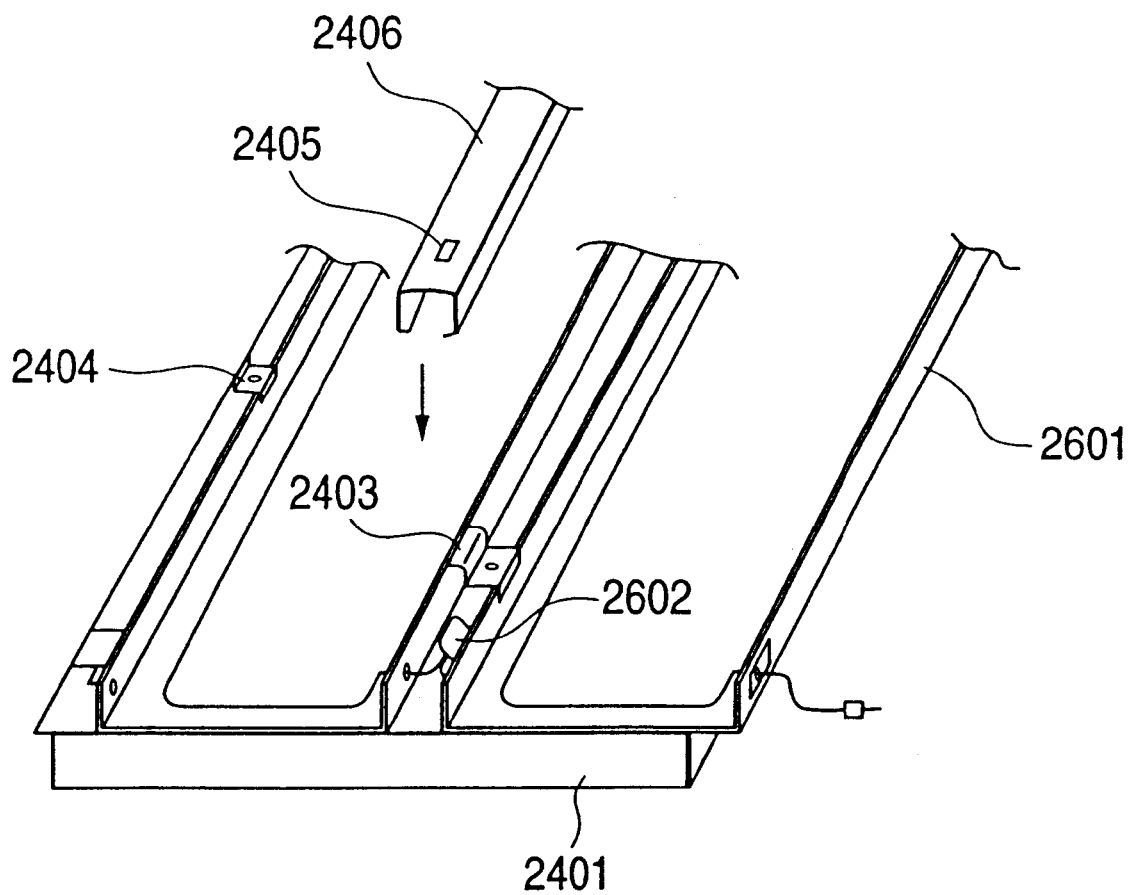
FIG. 24 is a perspective view showing one example of a roof panel with a photovoltaic module which is formed by using the photovoltaic module shown in FIGS. 22A and 22B.
Figure 26:
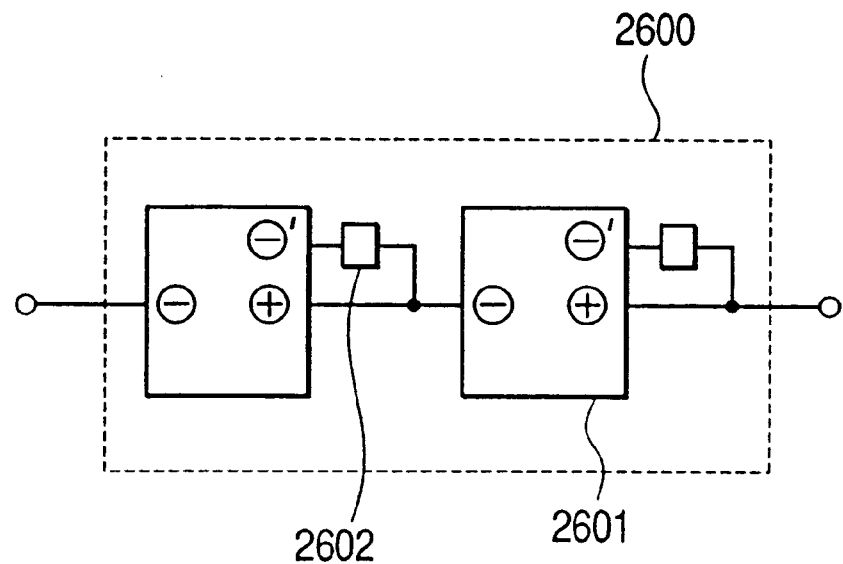
FIG. 26 is a block diagram showing the constitution of the roof panel shown in FIG. 24.
Figure 27:
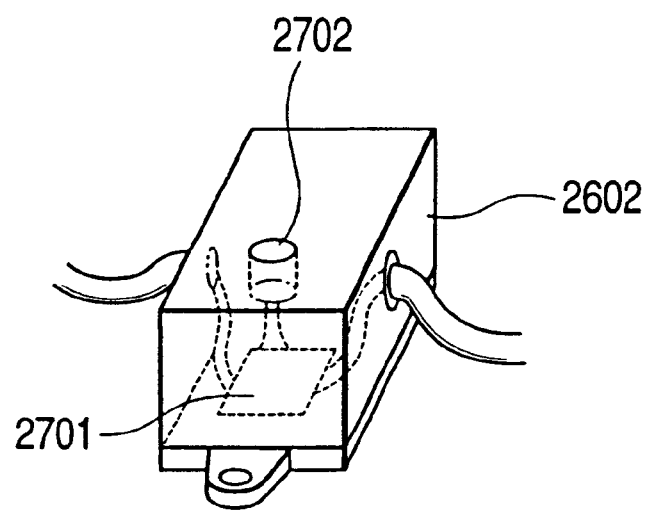
FIG. 27 is a perspective view showing one example of the constitution of an output terminal box shown in FIG. 26.

FIG. 26 is a circuit diagram of the roof panel with the photovoltaics 2600 of this example. FIG. 26 show a construction material-integrated photovoltaic module 2601, and an output terminal box 2602 for connecting the lead wires of the construction material-integrated photovoltaic modules 2601. FIG. 27 shows an output terminal box 2602. The output terminal box 2602 consists of a semiconductor integrated circuit 2701 constituting the voltage discrimination means, which is means for detecting the failure and a light emitting diode 2702 constituting the signal generating means for converting the output signal of the integrated circuit into light. The roof panel with the photovoltaics 2600 is constructed, as shown in FIG. 24, with a roof panel member 2401, the above-mentioned construction material-integrated photovoltaic module 2601 which is formed as the ribbed seam roof member, a two-sides fixing clip 2403 and a one-sided fixing clip 2404 for fixing the construction material-integrated photovoltaic modules 2601 to the roof panel 2401, an output terminal box 2602 for connecting the electrical output from the construction material-integrated photovoltaic module 2601, and a cap member 2406 for covering the connecting part of the construction material-integrated photovoltaic modules 2601. The cap member 2406 is provided with a window 2405 in a portion corresponding to the signal generating means 2702 shown in FIG. 27, and the failure of the photovoltaic module 2601 can be found out through the window 2405.

Figure 25:
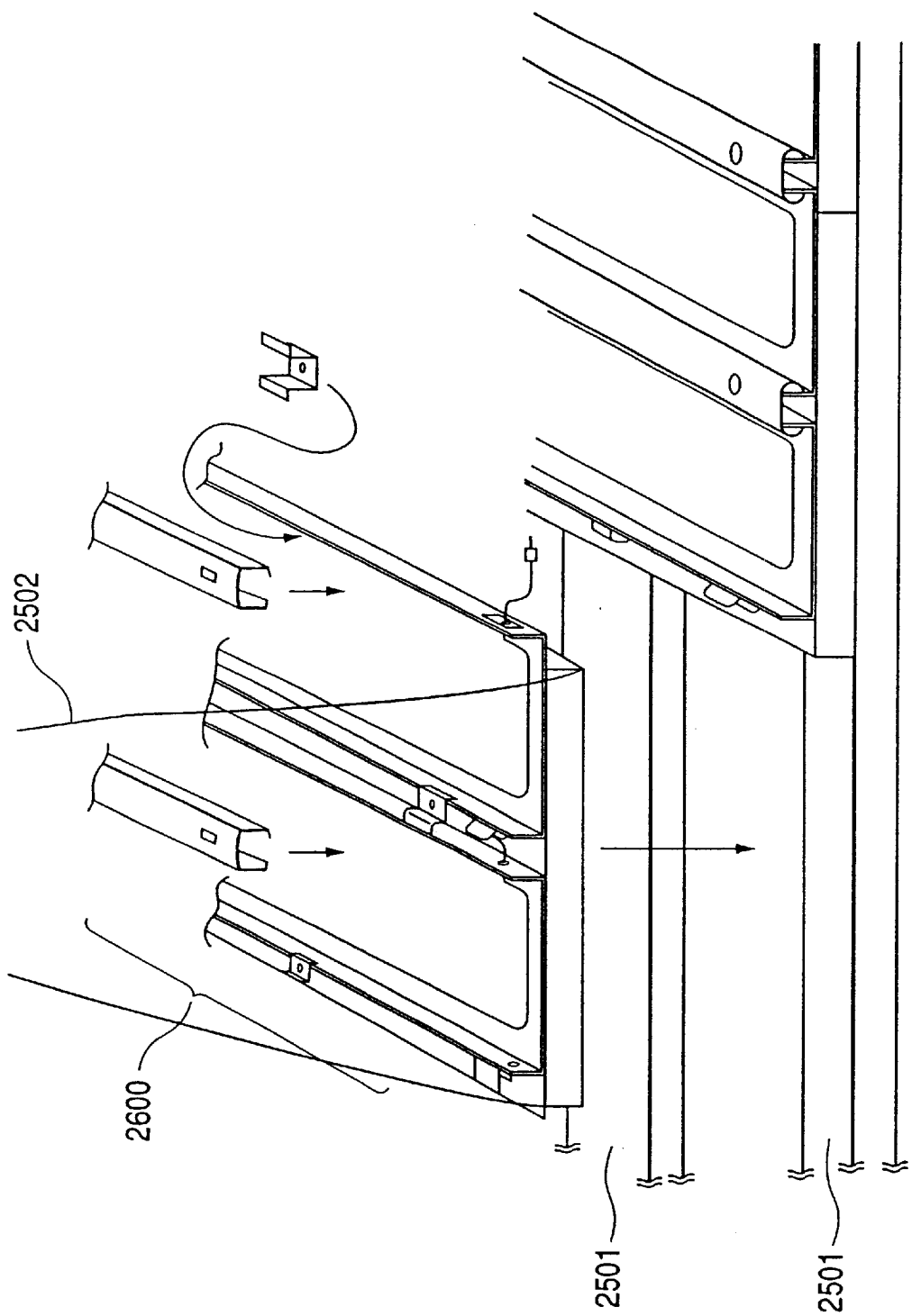
FIG. 25 is a view showing the state of installation of the roof panel with a photovoltaic module shown in FIG. 24.

FIG. 25 shows the state of installation of the roof panel with the solar panel shown in FIG. 24 on the roof surface. The roof panel with the solar panel 2600 is hoisted by a housing device 2502 such as a crane and is fixed to a main house 2501 itself to constitute the roof.

Figure 28:
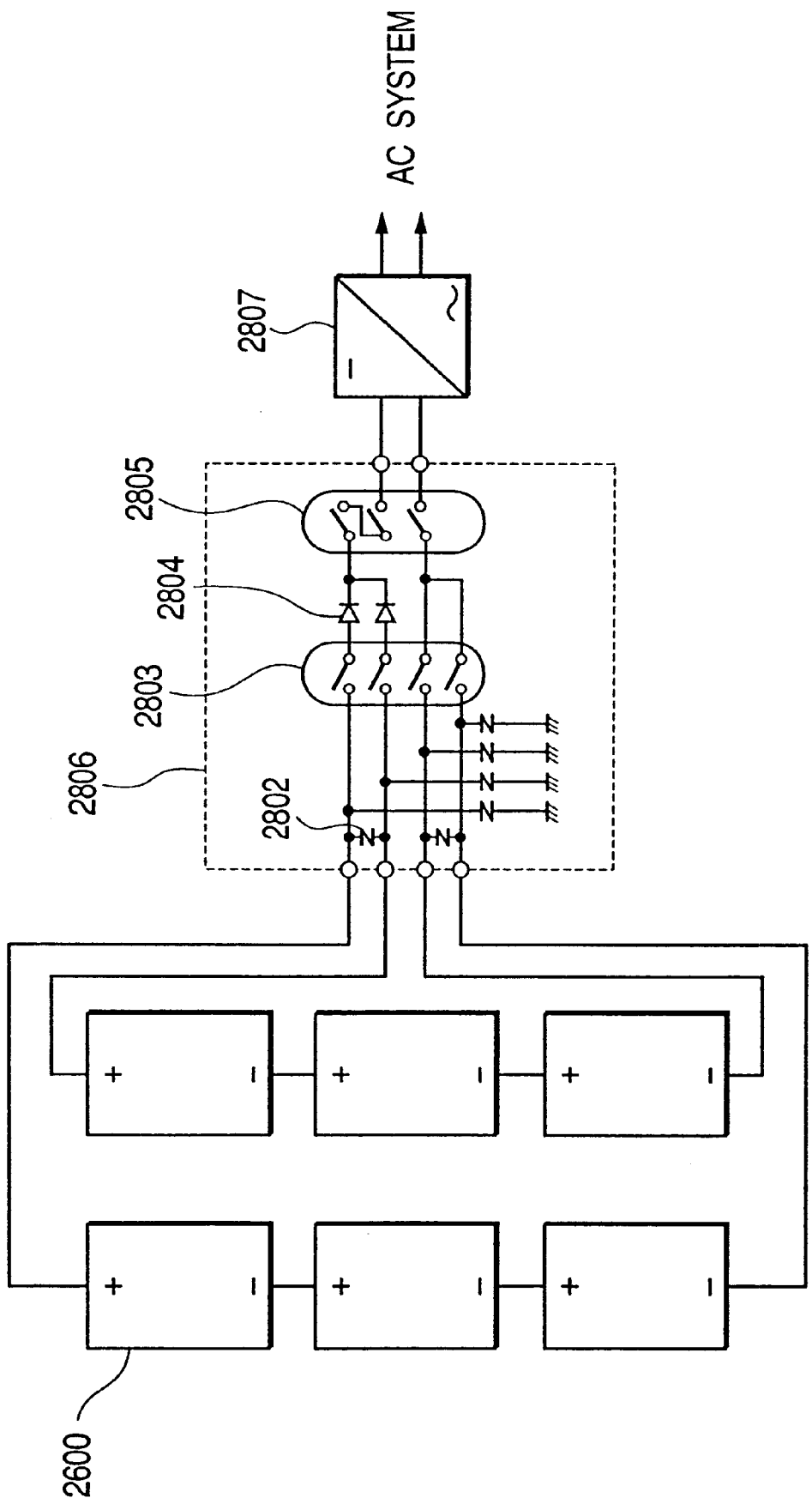
FIG. 28 is a block diagram showing the constitution of a solar light power generation apparatus composed of the roof panel with the photovoltaics shown in FIG. 24.
Figure 29:
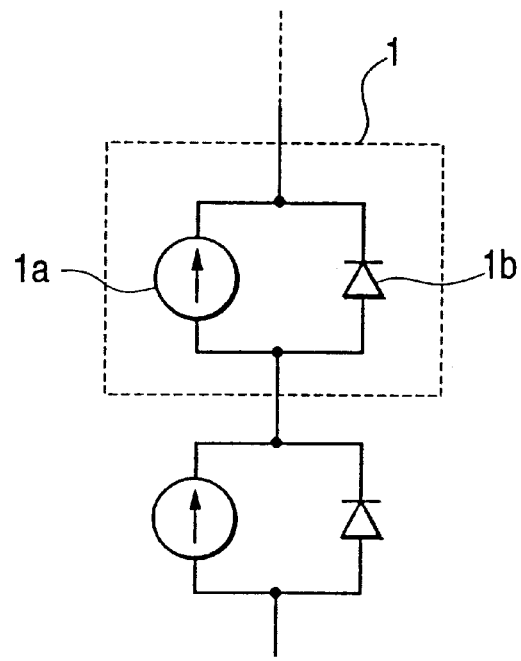
FIG. 29 is a block diagram showing the constitution of a conventional photovoltaic module.
Figure 30A:
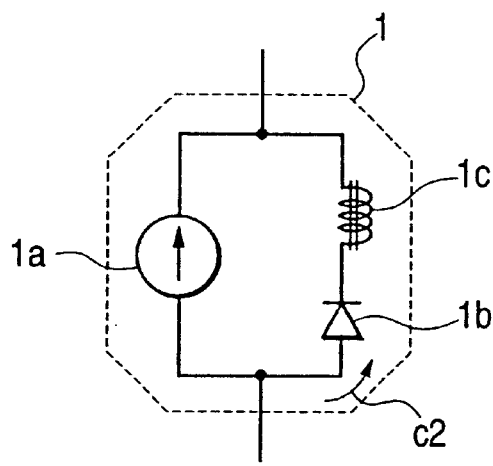
FIGS. 30A and 30B are circuit diagrams showing a known example in which the photovoltaic module shown in FIG. 29 is provided with a current detecting means.
Figure 30B:
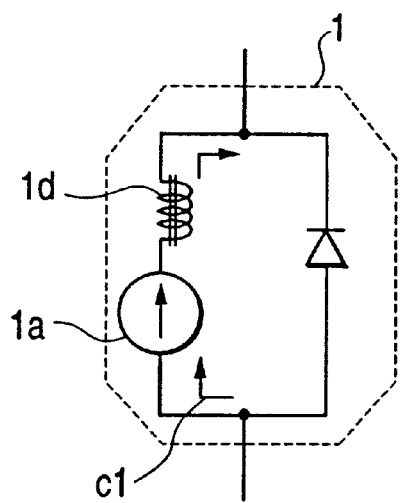
Figure 31:
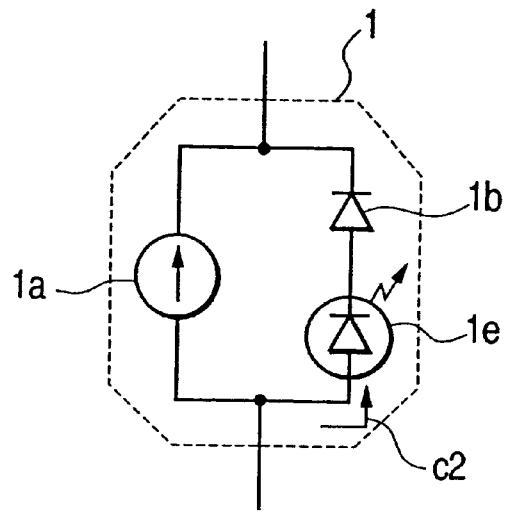
FIG. 31 is a view showing another known example in which the photovoltaic module shown in FIG. 29 is provided with a current detecting means.
Figure 32A:
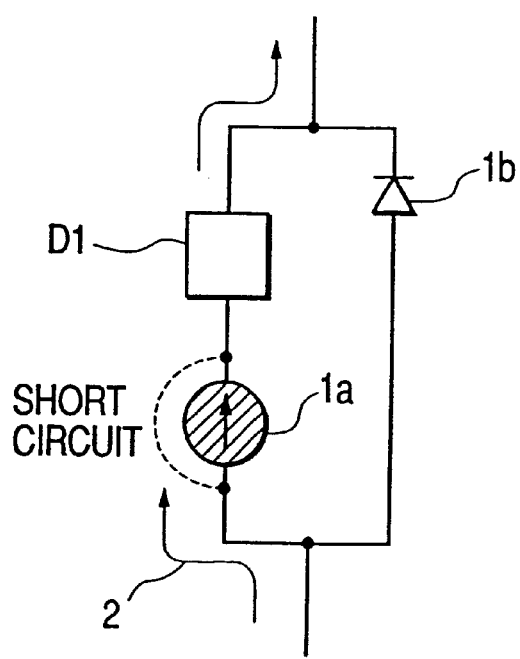
FIGS. 32A and 32B are circuit diagrams showing the state of the photovoltaics failed by a short circuit failure.
Figure 32B:
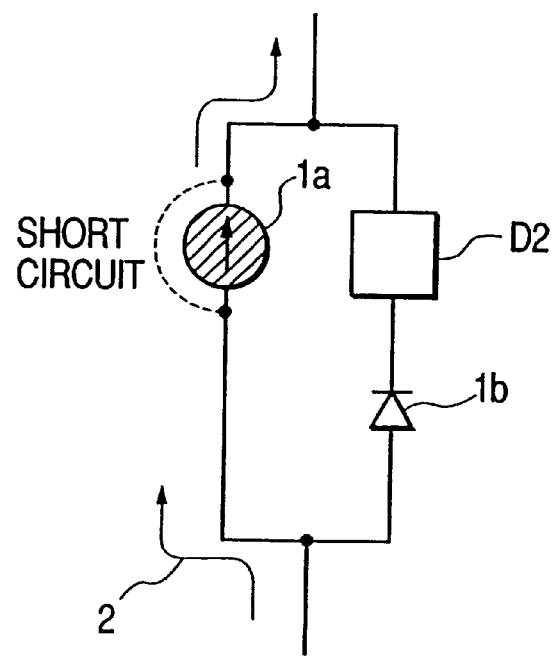

FIG. 28 shows a photovoltaic system comprising the roof panel with the photovoltaics 2600. FIG. 28 shows an arrester 2802, a DC switch 2803 at the side of the photovoltaics, blocking diodes 2804, a 3-line DC switch 2805, a junction box 2806 and an inverter 2807 for connection to the external system.

The roof panel with the photovoltaics 2600 of the present example provides a particular effect of promptly installing the photovoltaicses on the roof surface. Also the roof surface after installation appears the same as in the case of utilizing the general construction material-integrated photovoltaic modules. Though the installation and maintenance of the photovoltaics on the roof were expensive, the present example can facilitate the maintenance work because the failed module can be easily located. It is thus possible to achieve maintenance of the photovoltaic system in an inexpensive manner. Since the failure detection means is pre-assembled within the roof panel 2600 at the manufacturing factory, there is not required any particular wiring work for failure detection on the roof, so that the installation can be easily achieved. It is furthermore possible to form a ventilating groove by positioning the batten 1903 shown in Example 3, between the construction material-integrated photovoltaic module 2601 and the roof panel member 2401, and such configuration allows suppression of generated power loss due to the temperature characteristics of the photovoltaics, by the cooling effect of the air flowing in such a ventilating groove. Such air flow can also be used as the heat source for the building.

As explained in the foregoing, according to the present invention, it is possible to easily locate the failed photovoltaic module, regardless of the failure mode of the photovoltaics. It is thus possible to improve the efficiency of the maintenance and inspection works.

Also it is possible to increase design freedom of the photovoltaic module array, since failure detection is made possible in photovoltaic module arrays having various constitutions.

What is claimed is:

1. A photovoltaic module comprising photovoltaics and a signal generating means for generating a signal by application of a voltage, wherein said photovoltaics and said signal generating means are connected in parallel, the voltage is a voltage outputted by at least said photovoltaics which is connected in parallel with said signal generating means, said signal generating means and said photovoltaics are provided within a wiring of said photovoltaic module, said signal generating means includes a switching means, a circuit of which is closed or opened with light or magnetic field, and said signal generating means outputs a signal only when light or magnetic field is applied to said switching means.

2. The photovoltaic module according to claim 1, wherein said photovoltaics comprises a single photovoltaic cell, a string composed of a plurality of photovoltaic cells connected in series, or a parallel member composed of a plurality of photovoltaic cells connected in parallel.

3. The photovoltaic module according to claim 2, wherein said signal generating means is a light emitting means, a magnetic field generating means, an electric field generating means, a mechanical displacement generating means, a color development means or a combination thereof.

4. The photovoltaic module according to claim 2, further comprising a bypass diode, wherein said photovoltaics, said signal generating means and said bypass diode are connected in parallel.

5. The photovoltaic module according to claim 2, further comprising a construction material integrated with said photovoltaic module.

6. The photovoltaic module according to claim 5, further comprising a roof panel member integrated with said photovoltaic module.

7. The photovoltaic module according to claim 6, wherein said signal generating means is provided in the roof panel member.

8. A photovoltaic module comprising photovoltaics and a discrimination means for generating a signal by application of a predetermined voltage, wherein said discrimination means includes a signal generating means for generating a signal in response to a signal generated by said discrimination means, said photovoltaics and said discrimination means are connected in parallel, the voltage is a voltage outputted by at least said photovoltaics which is connected in parallel with said discrimination means, said discrimination means and said photovoltaics are provided within a wiring of said photovoltaic module, said signal generating means includes a switching means, a circuit of which is closed or opened with light or magnetic field, and said signal generating means outputs a signal only when light or magnetic field is applied to said switching means.

9. The photovoltaic module according to claim 8, wherein said photovoltaics comprises a single photovoltaic cell, a string composed of a plurality of photovoltaic cells connected in series, or a parallel member composed of a plurality of photovoltaic cells connected in parallel.

10. The photovoltaic module according to claim 9, wherein said signal generating means is a light emitting means, a magnetic field generating means, an electric field generating means, a mechanical displacement generating means, a color development means or a combination thereof.

11. The photovoltaic module according to claim 9, further comprising a bypass diode, wherein said photovoltaics, said discrimination means and said bypass diode are connected in parallel.

12. The photovoltaic module according to claim 9, further comprising a construction material integrated with said photovoltaic module.

13. The photovoltaic module according to claim 12, further comprising a roof panel member integrated with said photovoltaic module.

14. The photovoltaic module according to claim 13, wherein said discrimination means and said signal generating means are provided in the roof panel member.

15. A photovoltaic module comprising photovoltaics and a signal generating means for generating a signal by application of an electrical power, wherein said photovoltaics and said signal generating means are connected in parallel and in series, said signal generating means and said photovoltaics are provided within a wiring of said photovoltaic module, said signal generating means includes a switching means, a circuit of which is closed or opened with light or magnetic field, and said signal generating means outputs a signal only when light or magnetic field is applied to said switching means.

16. The photovoltaic module according to claim 15, wherein said photovoltaics comprises a single photovoltaic cell, a string composed of plurality of photovoltaic cells connected in series, or a parallel member composed of a plurality of photovoltaic cells connected in parallel.

17. The photovoltaic module according to claim 16, wherein said signal generating means is a light emitting means, a magnetic field generating means, an electric field generating means, a mechanical displacement generating means, a color development means or a combination thereof.

18. The photovoltaic module according to claim 16, further comprising a bypass diode, wherein said photovoltaics and said bypass diode are connected in parallel.

19. The photovoltaic module according to claim 16, further comprising a construction material integrated with said photovoltaic module.

20. The photovoltaic module according to claim 19, further comprising a roof panel member to be integrated with said photovoltaic module.

21. The photovoltaic module according to claim 20, wherein said signal generating means is provided in the roof panel member.

22. A photovoltaic module comprising photovoltaics and a discrimination means for generating a signal by application of a predetermined electric power, wherein said discrimination means includes a signal generation means for generating a signal in response to a signal generated by said discrimination means, said photovoltaics and said discrimination means are connected in parallel and in series, said discrimination means and said photovoltaics are provided within a wiring of said photovoltaic module, said signal generating means includes a switching means, a circuit of which is closed or opened with light or magnetic field, and said signal generating means outputs a signal only when light or magnetic field is applied to said switching means.

23. The photovoltaic module according to claim 22, wherein said photovoltaics comprises a single photovoltaic cell, a string composed of a plurality of photovoltaic cells connected in series, or a parallel member composed of a plurality of photovoltaic cells connected in parallel.

24. The photovoltaic module according to claim 23, wherein said signal generating means is a light emitting means, a magnetic field generating means, an electric field generating means, a mechanical displacement generating means, a color development means or a combination thereof.

25. The photovoltaic module according to claim 23, further comprising a bypass diode, wherein said photovoltaics and said bypass diode are connected in parallel.

26. The photovoltaic module according to claim 23, further comprising a construction material integrated with said photovoltaic module.

27. The photovoltaic module according to claim 26, further comprising a roof panel member integrated with said photovoltaic module.

28. The photovoltaic module according to claim 27, wherein said discrimination means and said signal generating means are provided in said roof panel member.

* * * * *

UNITED STATES PATENT AND TRADEMARK OFFICE
CERTIFICATE OF CORRECTION

PATENT NO.     : 6,515,215 B1
DATED          : February 4, 2003
INVENTOR(S)    : Toshihiko Mimura It is certified that error appears in the above-identified patent and that said Letters Patent is hereby corrected as shown below:

Title page,
Item [57], ABSTRACT,
Lines 7-8, "and detect" should be deleted.

Column 1,
Line 31, "voltage" should read -- the voltage --.

Column 2,
Line 23, "failure, and" should read -- failure; --; and
Line 50, "such" should read -- such a --.

Column 3,
Line 35, "negligible" should read -- negligible, --.

Column 5,
Line 35, "module." should read -- module --.

Column 9,
Line 50, "means," should read -- means --.

Column 10,
Line 2, "further" should be deleted; and
Line 7, "power," should read -- power --; and
Lines 10 and 11, "diode" should read -- diode --;

Column 11,
Line 35, "blocking-diodes" should read -- blocking diodes --.

UNITED STATES PATENT AND TRADEMARK OFFICE
CERTIFICATE OF CORRECTION

PATENT NO. : 6,515,215 B1
DATED : February 4, 2003
INVENTOR(S) : Toshihiko Mimura It is certified that error appears in the above-identified patent and that said Letters Patent is hereby corrected as shown below:

Column 12,
Line 5, "voltage," should read -- voltage --.

Signed and Sealed this

Sixth Day of July, 2004

JON W. DUDAS
*Acting Director of the United States Patent and Trademark Office*